(12) United States Patent
Pachamuthu et al.

(10) Patent No.: US 9,443,861 B1
(45) Date of Patent: Sep. 13, 2016

(54) FLUORINE-BLOCKING INSULATING SPACER FOR BACKSIDE CONTACT STRUCTURE OF THREE-DIMENSIONAL MEMORY STRUCTURES

(71) Applicant: SANDISK TECHNOLOGIES, INC., Plano, TX (US)

(72) Inventors: Jayavel Pachamuthu, San Jose, CA (US); Ching-Huang Lu, Fremont, CA (US); Johann Alsmeier, San Jose, CA (US)

(73) Assignee: SANDISK TECHNOLOGIES LLC, Plano, TX (US)

( * ) Notice: Subject to any disclaimer, the term of this patent is extended or adjusted under 35 U.S.C. 154(b) by 0 days.

(21) Appl. No.: 14/723,919

(22) Filed: May 28, 2015

(51) Int. Cl.
    *H01L 21/8238* (2006.01)
    *H01L 27/115* (2006.01)

(52) U.S. Cl.
    CPC ..... *H01L 27/11524* (2013.01); *H01L 27/1157* (2013.01); *H01L 27/11529* (2013.01); *H01L 27/11556* (2013.01); *H01L 27/11573* (2013.01); *H01L 27/11582* (2013.01)

(58) Field of Classification Search
    CPC .............. H01L 27/11524; H01L 27/11529; H01L 27/11556; H01L 27/1157; H01L 27/11573; H01L 27/11582
    USPC .......................................................... 438/211
    See application file for complete search history.

(56) References Cited

U.S. PATENT DOCUMENTS

| | | |
|---|---|---|
| 5,915,167 A | 6/1999 | Leedy |
| 7,005,350 B2 | 2/2006 | Walker et al. |
| 7,023,739 B2 | 4/2006 | Chen et al. |
| 7,177,191 B2 | 2/2007 | Fasoli et al. |
| 7,221,588 B2 | 5/2007 | Fasoli et al. |
| 7,233,522 B2 | 6/2007 | Chen et al. |
| 7,514,321 B2 | 4/2009 | Mokhlesi et al. |

(Continued)

FOREIGN PATENT DOCUMENTS

WO     WO02/15277 A2     2/2002

OTHER PUBLICATIONS

Jang et al., "Vertical Cell Array Using TCAT (Terabit Cell Array Transistor) Technology for Ultra High Density NAND Flash Memory," 2009 Symposium on VLSI Technology Digest of Technical Papers, pp. 192-193.

(Continued)

*Primary Examiner* — Luan C Thai
(74) *Attorney, Agent, or Firm* — The Marbury Law Group PLLC

(57) ABSTRACT

Electrical shorts caused by diffusion of residual fluorine in metallic layers can be retarded or eliminated by forming fluorine-blocking structures. A stack of alternating layers including electrically insulating layers and electrically conductive layers with a vertically extending trench is provided. In one embodiment, an insulating spacer can be formed by depositing a silicon nitride layer and partially or fully converting the silicon nitride layer into a silicon oxynitride layer, and by performing an anisotropic etch. Alternatively, an insulating spacer can be formed by forming a stack of a silicon nitride layer and a silicon oxide layer, and by performing an anisotropic etch. The silicon nitride layer or the silicon oxynitride layer can retard fluorine diffusion. Yet alternately, sidewalls of the electrically conductive layers can be nitrided to form metallic nitride portions that retard fluorine diffusion.

19 Claims, 24 Drawing Sheets

(56) References Cited

U.S. PATENT DOCUMENTS

| | | | |
|---|---|---|---|
| 7,575,973 B2 | 8/2009 | Mokhlesi et al. | |
| 7,696,559 B2 | 4/2010 | Arai et al. | |
| 7,745,265 B2 | 6/2010 | Mokhlesi et al. | |
| 7,808,038 B2 | 10/2010 | Mokhlesi et al. | |
| 7,848,145 B2 | 12/2010 | Mokhlesi et al. | |
| 7,851,851 B2 | 12/2010 | Mokhlesi et al. | |
| 8,008,710 B2 | 8/2011 | Fukuzumi et al. | |
| 8,053,829 B2 | 11/2011 | Kang et al. | |
| 8,187,936 B2 | 5/2012 | Alsmeier et al. | |
| 8,394,716 B2 | 3/2013 | Hwang et al. | |
| 8,877,624 B2 * | 11/2014 | Hull | H01L 29/401 438/591 |
| 8,987,089 B1 * | 3/2015 | Pachamuthu | H01L 27/11551 438/268 |
| 2007/0210338 A1 | 9/2007 | Orlowski | |
| 2007/0252201 A1 | 11/2007 | Kito et al. | |
| 2008/0116583 A1 | 5/2008 | Yuki | |
| 2009/0230449 A1 | 9/2009 | Sakaguchi et al. | |
| 2009/0242967 A1 | 10/2009 | Katsumata et al. | |
| 2010/0044778 A1 | 2/2010 | Seol et al. | |
| 2010/0112769 A1 | 5/2010 | Son et al. | |
| 2010/0120214 A1 | 5/2010 | Park et al. | |
| 2010/0155810 A1 | 6/2010 | Kim et al. | |
| 2010/0155818 A1 | 6/2010 | Cho et al. | |
| 2010/0181610 A1 | 7/2010 | Kim et al. | |
| 2010/0207195 A1 | 8/2010 | Fukuzumi et al. | |
| 2010/0320528 A1 | 12/2010 | Jeong et al. | |
| 2011/0076819 A1 | 3/2011 | Kim et al. | |
| 2011/0133606 A1 | 6/2011 | Yoshida et al. | |
| 2011/0151667 A1 | 6/2011 | Hwang et al. | |
| 2011/0266606 A1 | 11/2011 | Park et al. | |
| 2012/0001247 A1 | 1/2012 | Alsmeier | |
| 2012/0001249 A1 | 1/2012 | Alsmeier et al. | |
| 2012/0001250 A1 | 1/2012 | Alsmeier | |
| 2012/0012920 A1 | 1/2012 | Shin et al. | |
| 2012/0119287 A1 | 5/2012 | Park et al. | |
| 2013/0126957 A1 | 5/2013 | Higashitani et al. | |
| 2013/0264631 A1 | 10/2013 | Alsmeier et al. | |

OTHER PUBLICATIONS

Katsumata et al., "Pipe-Shaped BiCS Flash Memory with 16 Stacked Layers and Multi-Level-Cell Operation for Ultra High Density Storage Devices," 2009 Symposium on VLSI Technology Digest of Technical Papers, pp. 136-137.

Maeda et al., "Multi-Stacked 1G Cell/Layer Pipe-Shaped BiCS Flash Memory," 2009 Symposium on VLSI Technology Digest of Technical Papers, pp. 22-23.

Endoh et al., "Novel Ultra High Density Memory with a Stacked-Surrounding Gate Transistor (S-SGT) Structured Cell," IEDM Proc. (2001) 33-36.

Tanaka et al., "Bit-Cost Scalable Technology for Low-Cost and Ultrahigh-Density Flash Memory," Toshiba Review, vol. 63, No. 2, 2008, pp. 28-31.

Kimura, "3D Cells Make Terabit NAND Flash Possible," Nikkei Electronics Asia, Sep. 17, 2009, 6pgs.

International Search Report & Written Opinion, PCT/US2011/042566, Jan. 17, 2012.

Invitation to Pay Additional Fees & Partial International Search Report, PCT/US2011/042566, Sep. 28, 2011.

International Search Report, PCT/US2013/035567, Sep. 30, 2013, 6pgs.

Office Communication Concerning Corresponding U.S. Appl. No. 14/501,539, filed Sep. 30, 2014, (19 pages).

U.S. Appl. No. 14/133,979, filed Dec. 19, 2013, SanDisk Technologies Inc.

U.S. Appl. No. 14/225,116, filed Mar. 25, 2014, SanDisk Technologies Inc.

U.S. Appl. No. 14/225,176, filed Mar. 25, 2014, SanDisk Technologies Inc.

U.S. Appl. No. 14/462,209, filed Aug. 14, 2014, SanDisk Technologies Inc.

U.S. Appl. No. 14/468,743, filed Aug. 26, 2014, SanDisk Technologies Inc.

U.S. Appl. No. 14/491,026, filed Sep. 19, 2014, SanDisk Technologies Inc.

U.S. Appl. No. 14/491,315, filed Sep. 19, 2014, SanDisk Technologies Inc.

U.S. Appl. No. 14/501,539, filed Sep. 30, 2014, SanDisk Technologies Inc.

U.S. Appl. No. 14/517,134, filed Oct. 17, 2014, SanDisk Technologies Inc.

U.S. Appl. No. 14/540,479, filed Nov. 13, 2014, SanDisk Technologies Inc.

U.S. Appl. No. 14/602,491, filed Jan. 22, 2015, SanDisk Technologies Inc.

* cited by examiner

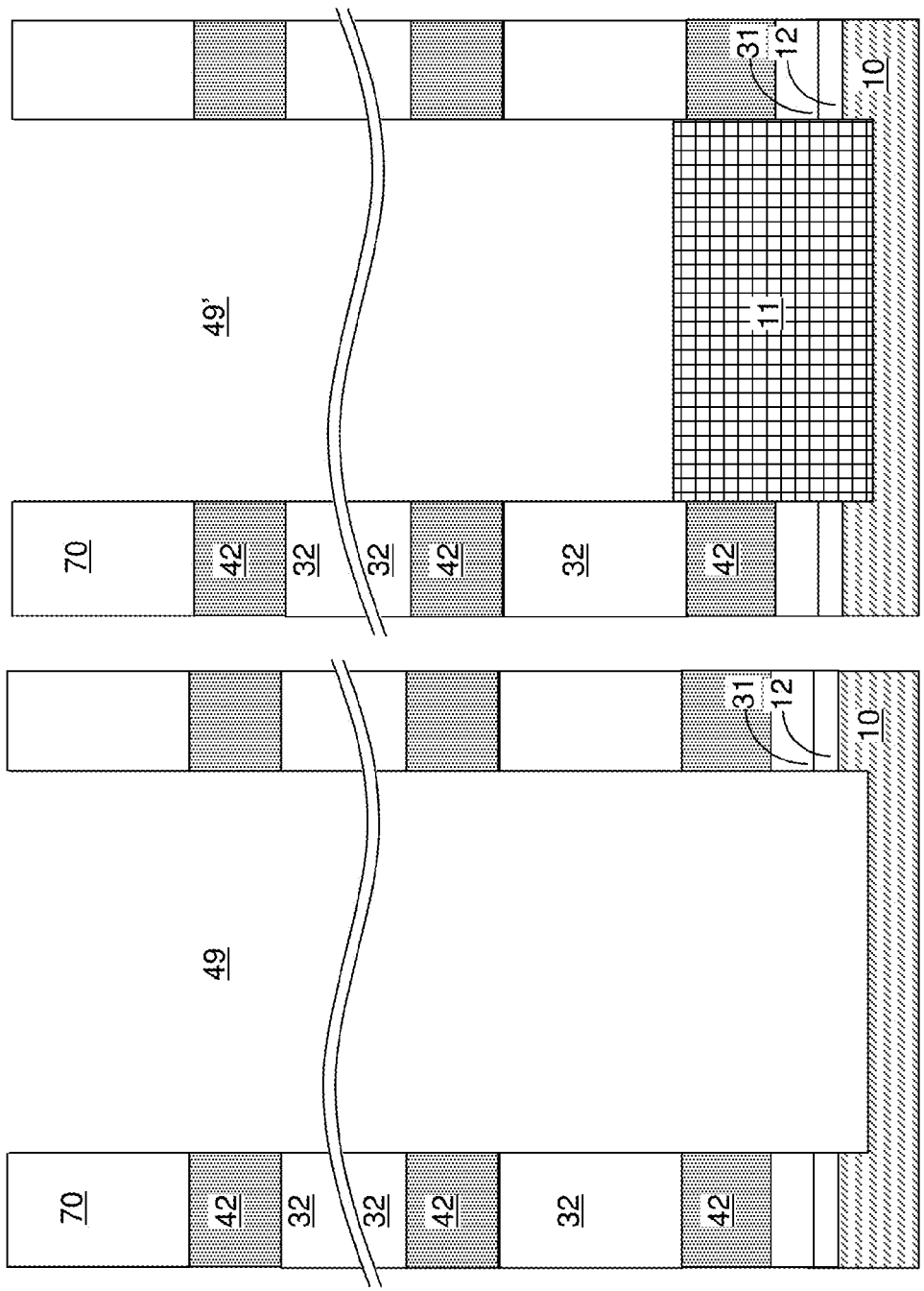

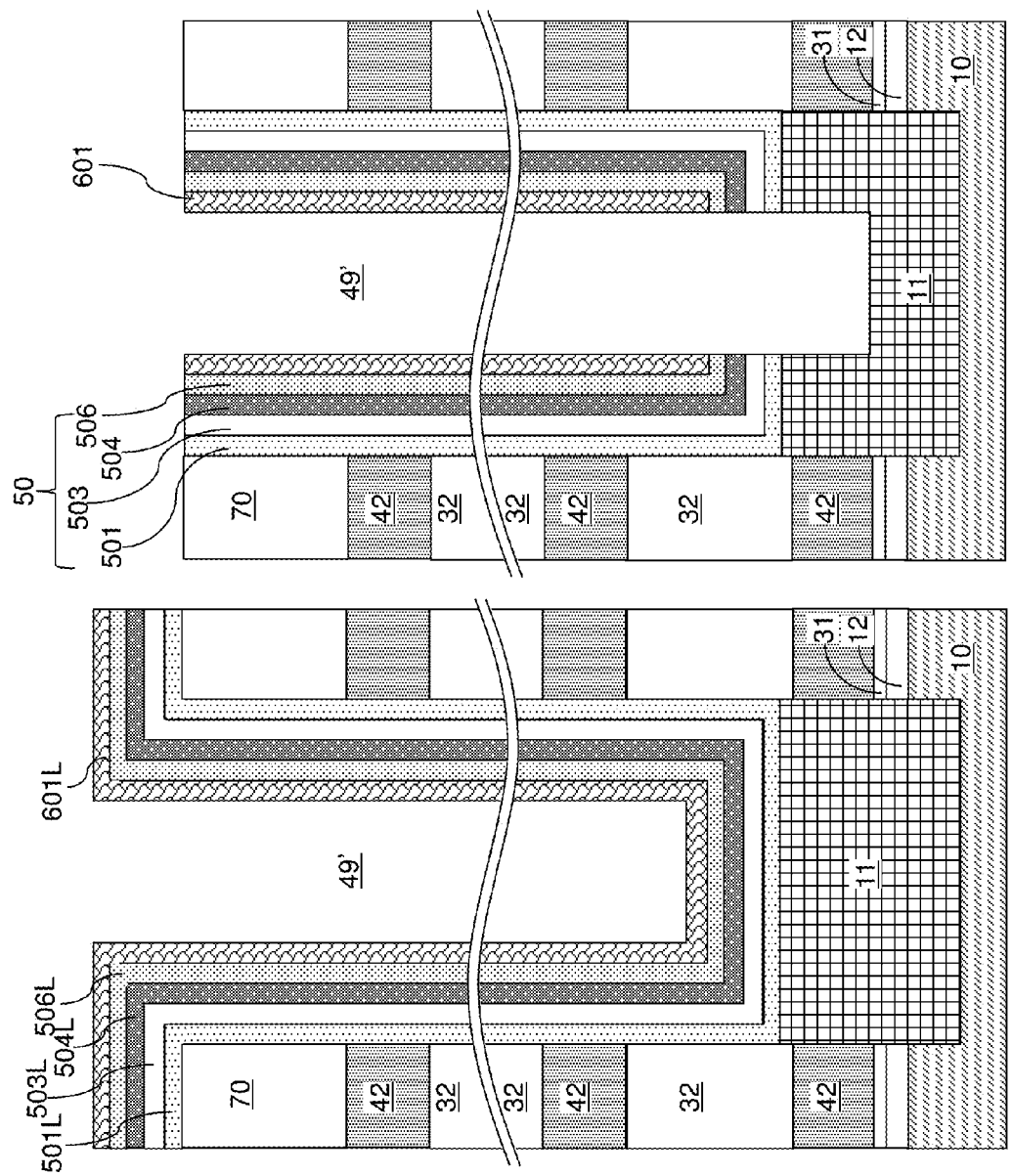

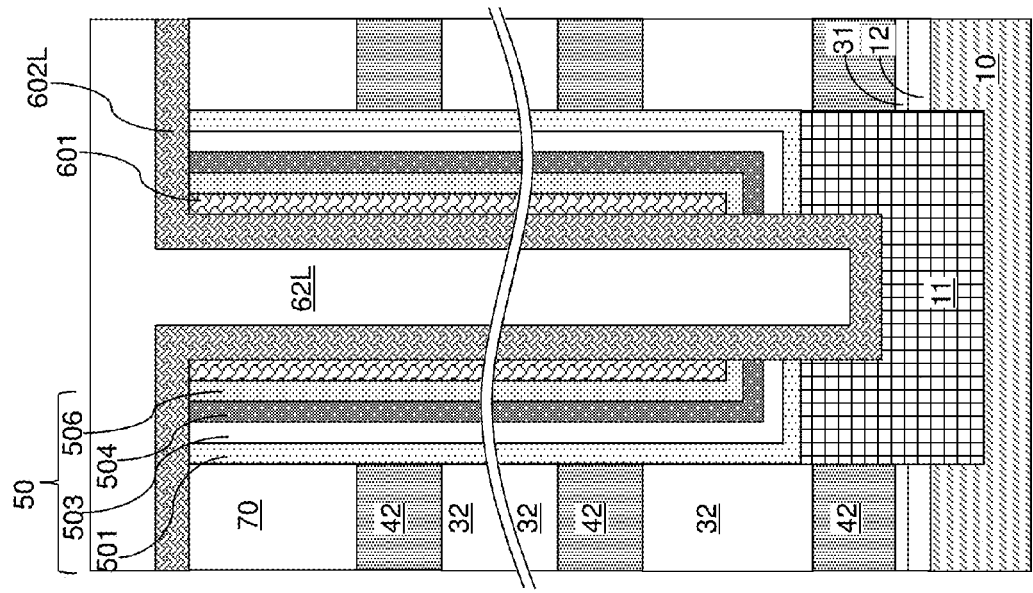
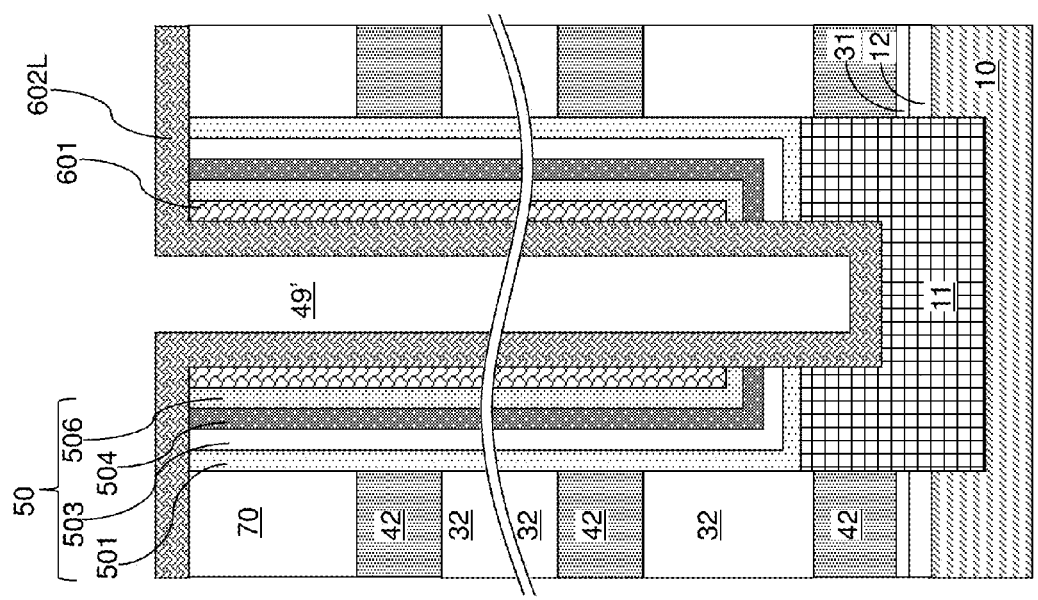

FLUORINE-BLOCKING INSULATING SPACER FOR BACKSIDE CONTACT STRUCTURE OF THREE-DIMENSIONAL MEMORY STRUCTURES

FIELD

The present disclosure relates generally to the field of three-dimensional memory devices and specifically to three-dimensional memory devices including a vertical stack of multilevel memory arrays and methods of making thereof.

BACKGROUND

Three-dimensional vertical NAND strings having one bit per cell are disclosed in an article by T. Endoh, et. al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a device structure comprises forming a stack of alternating layers comprising electrically insulating layers and sacrificial material layers over a substrate, forming a trench through the stack of alternating layers, replacing the sacrificial material layers with electrically conductive layers, forming at least one of silicon nitride or silicon oxynitride over at least a portion of sidewalls of the trench, and forming a contact via structure over the silicon nitride or silicon oxynitride.

According to an aspect of the present disclosure, a method of forming a device structure is provided. A stack of alternating layers comprising electrically insulating layers and sacrificial material layers is formed over a substrate. A trench is formed through the stack of alternating layers. The sacrificial material layers are replaced with electrically conductive layers. Surface portions of the electrically conductive layers at a peripheral region of the trench are converted into metal nitride portions by nitriding physically exposed surfaces of the electrically conductive layers. An insulating spacer is formed on the metal nitride portions. A contact via structure electrically shorted to a portion of the substrate is formed by depositing a conductive material in a cavity within the insulating spacer.

According to yet another aspect of the present disclosure, a memory device comprises a stack of alternating layers comprising electrically insulating layers and electrically conductive layers and located over a substrate, a trench extending through the stack of alternating layers, at least one of silicon nitride or silicon oxynitride located at a periphery of the trench, and a contact via structure comprising at least one conductive material located over the at least one of silicon nitride and silicon oxynitride. The device also comprises a memory opening extending through the stack of alternating layers, and a memory stack structure located in the memory opening. The memory stack structure comprises a memory film and a semiconductor channel contacting an inner sidewall of the memory film, and the electrically conductive layers comprise, or are electrically connected to, control gate electrodes for the memory stack structure.

BRIEF DESCRIPTION OF THE DRAWINGS

FIGS. 2A-2H are sequential vertical cross-sectional views of a memory opening within the first exemplary structure during various processing steps employed to form a memory stack structure according to the first embodiment of the present disclosure.

DETAILED DESCRIPTION

Figure 1:
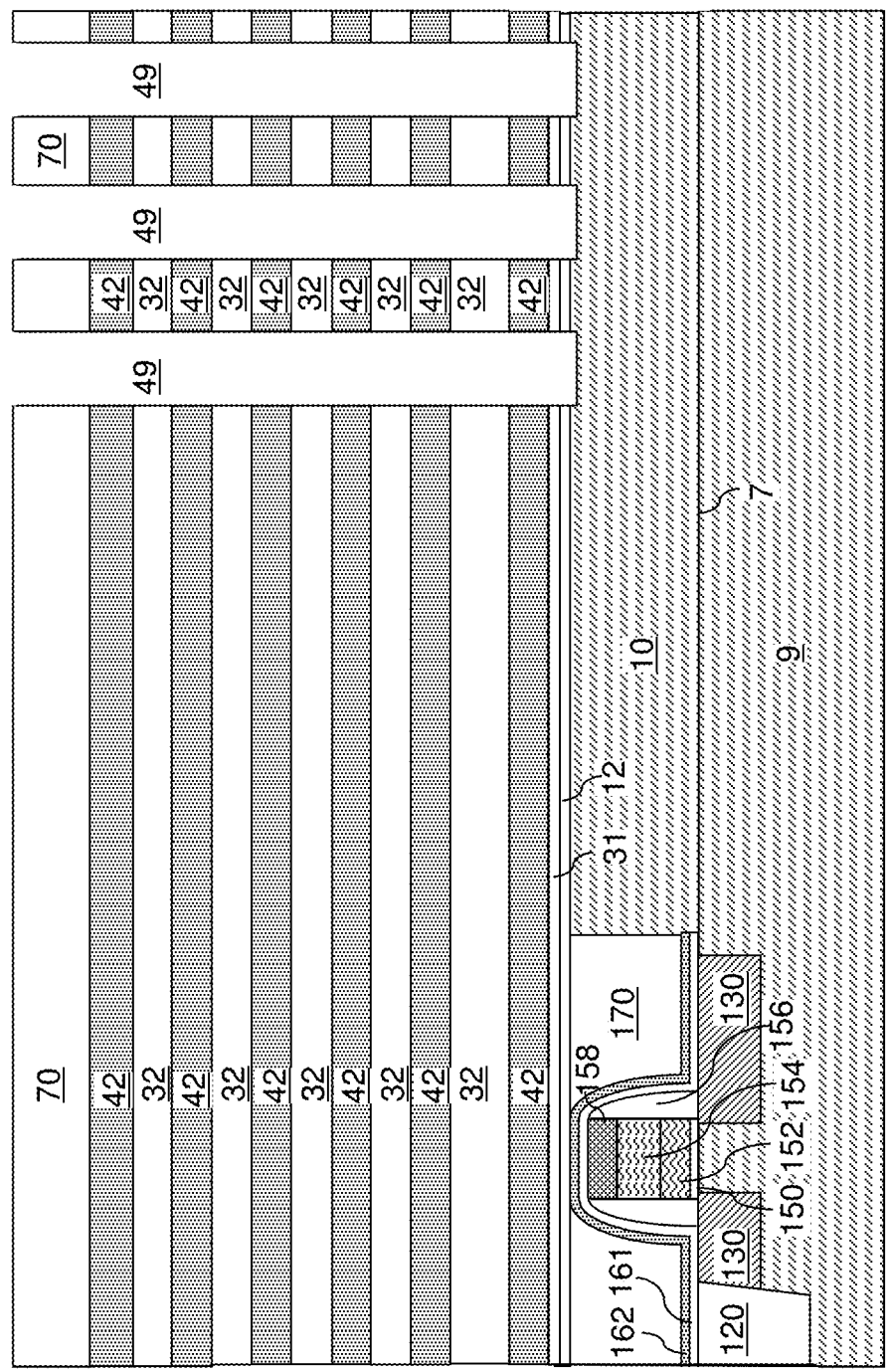
FIG. 1 is a vertical cross-sectional view of a first exemplary structure after formation of a stack including an alternating plurality of material layers and memory openings extending through the stack according to a first embodiment of the present disclosure.

As discussed above, the present disclosure is directed to three-dimensional memory devices including a vertical stack of multilevel memory arrays and methods of making thereof, the various aspects of which are described below. The embodiments of the disclosure can be employed to form various structures including a multilevel memory structure, non-limiting examples of which include semiconductor devices such as three-dimensional monolithic memory array devices comprising a plurality of NAND memory strings. The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. As used herein, a first element located "on" a second element can be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a substantially uniform thickness. A layer may extend over the entirety of an underlying or overlying structure, or may have an extent less than the extent of an underlying or overlying structure. Further, a layer may be a region of a homogeneous or inhomogeneous contiguous structure that has a thickness less than the thickness of the contiguous structure. For example, a layer may be located between any pair of horizontal planes between, or at, a top surface and a bottom surface of the contiguous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Referring to FIG. 1, a first exemplary structure according to the first embodiment of the present disclosure is illustrated, which can be employed, for example, to fabricate a device structure containing vertical NAND memory devices. The first exemplary structure includes a substrate, which can be a semiconductor substrate. The substrate can include a substrate semiconductor layer 9. The substrate semiconductor layer 9 is a semiconductor material layer, and can include at least one elemental semiconductor material, at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface.

As used herein, a "semiconductor material" refers to a material having electrical conductivity in the range from $1.0 \times 10^{-6}$ S/cm to $1.0 \times 10^{5}$ S/cm, and is capable of producing a doped material having electrical resistivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. All measurements for electrical conductivities are made at the standard condition. Optionally, at least one doped well (not expressly shown) can be formed within the substrate semiconductor layer 9.

At least one semiconductor device for a peripheral circuitry can be formed on a portion of the substrate semiconductor layer 9. The at least one semiconductor device can include, for example, field effect transistors. For example, at least one shallow trench isolation structure 120 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure (150, 152, 154, 158), each of which can include a gate dielectric 150, at least one gate electrode (152, 154), and a gate cap dielectric. A gate electrode (152, 154) may include a stack of a first gate electrode portion 152 and a second gate electrode portion 154. At least one gate spacer 156 can be formed around the at least one gate structure (150, 152, 154, 158) by depositing and anisotropically etching a conformal dielectric layer. Active regions 130 can be formed in upper portions of the substrate semiconductor layer 9, for example, by introducing electrical dopants employing the at least one gate structure (150, 152, 154, 158) as masking structures. Additional masks may be employed as needed. The active region 130 can include source regions and drain regions of field effect transistors. A first dielectric liner 161 and a second dielectric liner 162 can be optionally formed. Each of the first and second dielectric liners (161, 162) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 161 can be a silicon oxide layer, and the second dielectric liner 162 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 170. In one embodiment the planarized top surface of the planarization dielectric layer 170 can be coplanar with a top surface of the dielectric liners (161, 162). Subsequently, the planarization dielectric layer 170 and the dielectric liners (161, 162) can be removed from an area to physically expose a top surface of the substrate semiconductor layer 9.

An optional semiconductor material layer 10 can be formed on the top surface of the substrate semiconductor layer 9 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the semiconductor substrate layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 70 can be removed, for example, by chemical mechanical planarization (CMP). In this case, the semiconductor material layer 10 can have a top surface that is coplanar with the top surface of the planarization dielectric layer 170.

Optionally, a dielectric pad layer 12 can be formed above the semiconductor material layer 10 and the planarization dielectric layer 170. The dielectric pad layer 12 can be, for example, silicon oxide layer. The thickness of the dielectric pad layer 12 can be in a range from 3 nm to 30 nm, although lesser and greater thicknesses can also be employed.

A dielectric cap layer 31 can be optionally formed. The dielectric cap layer 31 includes a dielectric material, and can be formed directly on top surfaces of the gate electrode(s) (152, 154, 158). Exemplary materials that can be employed for the dielectric cap layer 31 include, but are not limited to, silicon oxide, a dielectric metal oxide, and silicon nitride (in case the material of second material layers to be subsequently formed is not silicon nitride). The dielectric cap layer 31 provides electrical isolation for the gate electrode(s).

A stack of an alternating plurality of first material layers (which can be insulating layers 32) and second material layers (which can be sacrificial material layer 42) is formed over the top surface of the substrate, which can be, for example, on the top surface of the dielectric cap layer 31. As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Subsequently, a lithographic material stack (not shown) including at least a photoresist layer can be formed over the insulating cap layer 70 and the alternating stack (32, 42), and can be lithographically patterned to form openings therein. The pattern in the lithographic material stack can be transferred through the insulating cap layer 70 and through entirety of the alternating stack (32, 42) by at least one anisotropic etch that employs the patterned lithographic material stack as an etch mask. Portions of the alternating stack (32, 42) underlying the openings in the patterned lithographic material stack are etched to form memory openings 49. In other words, the transfer of the pattern in the patterned lithographic material stack through the alternating stack (32, 42) forms the memory openings 49 that extend through the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. Optionally, the dielectric cap layer 31 may be used as an etch stop layer between the alternating stack (32, 42) and the substrate. The sidewalls of the memory openings 49 can be substantially vertical, or can be tapered. The patterned lithographic material stack can be subsequently removed, for example, by ashing.

The memory openings 49 are formed through the dielectric cap layer 31 and the dielectric pad layer 12 so that the memory openings 49 extend from the top surface of the alternating stack (32, 42) to at least the top surface of the semiconductor material layer 10. In one embodiment, an overetch into the semiconductor material layer 10 may be optionally performed after the top surface of the semiconductor material layer 10 is physically exposed at a bottom of each memory opening 49. The overetch may be performed prior to, or after, removal of the lithographic material stack. In other words, the recessed surfaces of the semiconductor material layer 10 may be vertically offset from the undressed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surface of each memory opening 49 can be coplanar with the topmost surface of the semiconductor material layer 10. Each of the memory openings 49 can include a sidewall (or a plurality of sidewalls) that extends substantially perpendicular to the topmost surface of the substrate. The region in which the array of memory openings 49 is formed is herein referred to as a device region. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 can be extend to a top surface of the semiconductor material layer 10.

A memory stack structure can be formed in each of the memory opening employing various embodiments of the present disclosure. FIGS. 2A-2F illustrate sequential vertical cross-sectional views of a memory opening within the first exemplary structure during formation of an exemplary memory stack structure according to a first embodiment of the present disclosure. Formation of the exemplary memory stack structure can be performed within each of the memory openings 49 in the first exemplary structure illustrated in FIG. 1.

Referring to FIG. 2A, a memory opening 49 in the first exemplary structure of FIG. 1 is illustrated. The memory opening 49 extends through the insulating cap layer 70, the alternating stack (32, 42), the dielectric cap layer 31, the dielectric pad layer 12, and optionally into an upper portion of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 2B, an optional epitaxial channel portion 11 can be formed at the bottom portion of each memory opening 49, for example, by selective epitaxy. Each epitaxial channel portion 11 comprises a single crystalline semiconductor material in epitaxial alignment with the single crystalline semiconductor material of the semiconductor material layer 10. In one embodiment, the epitaxial channel portion 11 can be doped with electrical dopants of the same conductivity type as the semiconductor material layer 10. In one embodiment, the top surface of each epitaxial channel portion 11 can be formed above a horizontal plane including the top surface of a sacrificial material layer 42. In this case, at least one source select gate electrode can be subsequently formed by replacing each sacrificial material layer 42 located below the horizontal plane including the top surfaces of the epitaxial channel portions 11 with a respective conductive material layer.

Referring to FIG. 2C, a series of layers including at least one blocking dielectric layer (501L, 503L), a memory material layer 504L, a tunneling dielectric layer 506L, and an optional first semiconductor channel layer 601L can be sequentially deposited in the memory openings 49. The at least one blocking dielectric layer (501L, 503L) can include, for example, a first blocking dielectric layer 501L and a second blocking dielectric layer 503L.

The first blocking dielectric layer 501L can be deposited on the sidewalls of each memory opening 49 by a conformal deposition method. The first blocking dielectric layer 501L includes a dielectric material, which can be a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the first blocking dielectric layer 501L can include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The first blocking dielectric layer 501L can be deposited, for example, by chemical vapor deposition (CVD), atomic layer deposition (ALD), pulsed laser deposition (PLD), liquid source misted chemical deposition, or a combination thereof. The thickness of the first blocking dielectric layer 501L can be in a range from 1 nm to 20 nm, although lesser and greater thicknesses can also be employed. The first blocking dielectric layer 501L can subsequently function as a dielectric material portion that blocks leakage of stored electrical charges to control gate electrodes. In one embodiment, the first blocking dielectric layer 501L includes aluminum oxide.

The second blocking dielectric layer 503L can be formed on the first blocking dielectric layer 501L. The second blocking dielectric layer 503L can include a dielectric material that is different from the dielectric material of the first blocking dielectric layer 501L. In one embodiment, the second blocking dielectric layer 503L can include silicon oxide, a dielectric metal oxide having a different composition than the first blocking dielectric layer 501L, silicon oxynitride, silicon nitride, or a combination thereof. In one embodiment, the second blocking dielectric layer 503L can include silicon oxide. The second blocking dielectric layer 503L can be formed by a conformal deposition method such as low pressure chemical vapor deposition, atomic layer deposition, or a combination thereof. The thickness of the second blocking dielectric layer 503L can be in a range from 1 nm to 20 nm, although lesser and greater thicknesses can also be employed. Alternatively, the first blocking dielectric layer 501L and/or the second blocking dielectric layer 503L can be omitted, and a blocking dielectric layer can be formed after formation of backside recesses on surfaces of memory films to be subsequently formed.

Subsequently, the memory material layer 504L, the tunneling dielectric layer 506L, and the optional first semiconductor channel layer 601L can be sequentially formed. In one embodiment, the memory material layer 504L can be a charge trapping material including a dielectric charge trapping material, which can be, for example, silicon nitride. Alternatively, the memory material layer 504L can include a conductive material such as doped polysilicon or a metallic material that is patterned into multiple electrically isolated portions (e.g., floating gates), for example, by being formed within lateral recesses into sacrificial material layers 42. In one embodiment, the memory material layer 504L includes a silicon nitride layer.

The memory material layer 504L can be formed as a single memory material layer of homogeneous composition, or can include a stack of multiple memory material layers. The multiple memory material layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the memory material layer 504L may comprise an insulating charge trapping material, such as one or more silicon nitride segments. Alternatively, the memory material layer 504L may comprise conductive nanoparticles such as metal nanoparticles, which can be, for example, ruthenium nanoparticles. The memory material layer 504L can be formed, for example, by chemical vapor deposition (CVD), atomic layer deposition (ALD), physical vapor deposition (PVD), or any suitable deposition technique for storing electrical charges therein. The thickness of the memory material layer 504L can be in a range from 2 nm to 20 nm, although lesser and greater thicknesses can also be employed.

The tunneling dielectric layer 506L includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 506L can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 506L can include a stack of a first silicon oxide layer, a silicon oxynitride layer, and a second silicon oxide layer, which is commonly known as an ONO stack. In one embodiment, the tunneling dielectric layer 506L can include a silicon oxide layer that is substantially free of carbon or a silicon oxynitride layer that is substantially free of carbon. The thickness of the tunneling dielectric layer 506L can be in a range from 2 nm to 20 nm, although lesser and greater thicknesses can also be employed.

The optional first semiconductor channel layer 601L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601L includes amorphous silicon or polysilicon. The first semiconductor channel layer 601L can be formed by a conformal deposition method such as low pressure chemical vapor deposition (LPCVD). The thickness of the first semiconductor channel layer 601L can be in a range from 2 nm to 10 nm, although lesser and greater thicknesses can also be employed. A cavity 49' is formed in the volume of each memory opening 49 that is not filled with the deposited material layers (501L, 503L, 504L, 506*l*, 601L).

Referring to FIG. 2D, the optional first semiconductor channel layer 601L, the tunneling dielectric layer 506L, the memory material layer 504L, the at least one blocking dielectric layer (501L, 503L) are sequentially anisotropically etched employing at least one anisotropic etch process. The portions of the first semiconductor channel layer 601L, the tunneling dielectric layer 506L, the memory material layer 504L, and the at least one blocking dielectric layer (501L, 503L) located above the top surface of the insulating cap layer 70 can be removed by the at least one anisotropic etch process. Further, the horizontal portions of the first semiconductor channel layer 601L, the tunneling dielectric layer 506L, the memory material layer 504L, and the at least one blocking dielectric layer (501L, 503L) at a bottom of each cavity 49' can be removed to form openings in remaining portions thereof. Each of the first semiconductor channel layer 601L, the tunneling dielectric layer 506L, the memory material layer 504L, and the at least one blocking dielectric layer (501L, 503L) can be etched by anisotropic etch process.

Each remaining portion of the first semiconductor channel layer 601L constitutes a first semiconductor channel portion 601. Each remaining portion of the tunneling dielectric layer 506L constitutes a tunneling dielectric 506. Each remaining portion of the memory material layer 504L is herein referred to as a charge storage element 504. In one embodiment, the charge storage element 504 can be a contiguous layer, i.e., can be a charge storage layer. Each remaining portion of the second blocking dielectric layer 503L is herein referred to as a second blocking dielectric 503. Each remaining portion of the first blocking dielectric layer 501L is herein referred to as a first blocking dielectric 501. A surface of the epitaxial channel portion 11 can be physically exposed underneath the opening through the first semiconductor channel portion 601, the tunneling dielectric 506, the charge storage element 504, and the at least one blocking dielectric (501, 503). Optionally, the physically exposed portion of the epitaxial channel portion 11 can be vertically recessed. A tunneling dielectric 506 is embedded within a charge storage element 504. The charge storage element 504 can comprise a charge trapping material or a floating gate material.

The set of the tunneling dielectric 506, the charge storage element 504, the second blocking dielectric 503, and the first blocking dielectric 501 collectively constitutes a memory film 50. In one embodiment, the first semiconductor channel portion 601, the tunneling dielectric 506, the charge storage element 504, the second blocking dielectric 503, and the first blocking dielectric 501 can have vertically coincident sidewalls. As used herein, a first surface is "vertically coincident" with a second surface if there exists a vertical plane including both the first surface and the second surface. Such a vertical plane may, or may not, have a horizontal curvature, but does not include any curvature along the vertical direction, i.e., extends straight up and down.

Referring to FIG. 2E, a second semiconductor channel layer 602L can be deposited directly on the semiconductor surface of the epitaxial channel portion 11 over the substrate (9, 10), and directly on the first semiconductor channel portion 601. The second semiconductor channel layer 602L includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602L includes amorphous silicon or polysilicon. The second semiconductor channel layer 602L can be formed by a conformal deposition method such as low pressure chemical vapor deposition (LPCVD). The thickness of the second semiconductor channel layer 602L can be in a range from 2 nm to 10 nm, although lesser and greater thicknesses can also be employed. The second semiconductor channel layer 602L may partially fill the cavity 49' in each memory opening, or may fully fill the cavity in each memory opening.

The materials of the first semiconductor channel portion 601 and the second semiconductor channel layer 602L are collectively referred to as a semiconductor channel material. In other words, the semiconductor channel material is a set of all semiconductor material in the first semiconductor channel portion 601 and the second semiconductor channel layer 602L.

Referring to FIG. 2F, in case the cavity 49' in each memory opening is not completely filled by the second semiconductor channel layer 602L, a dielectric core layer 62L can be deposited in the cavity 49' to fill any remaining portion of the cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Figure 2G:
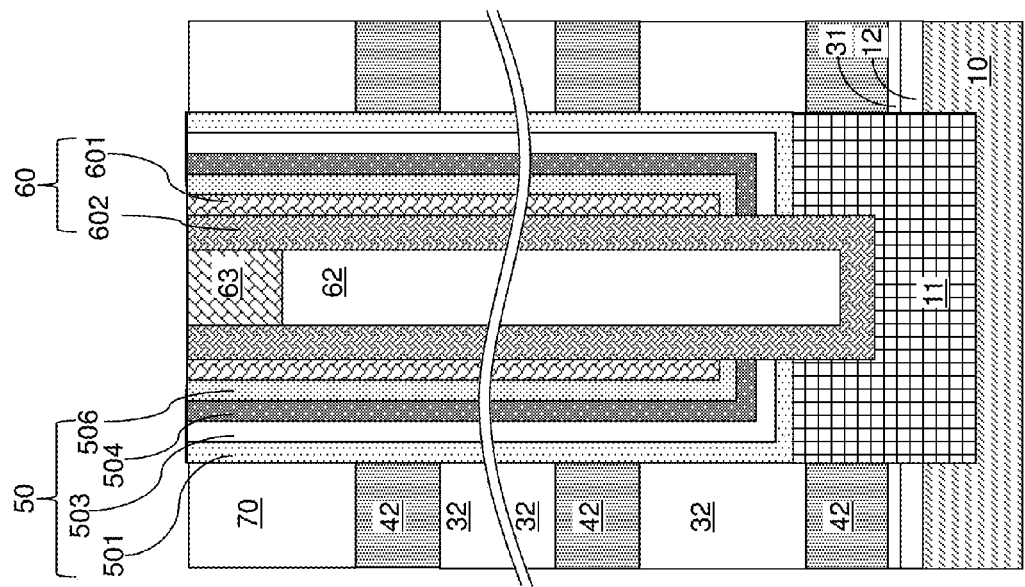

Referring to FIG. 2G, the horizontal portion of the dielectric core layer 62L can be removed, for example, by a recess etch from above the top surface of the insulating cap layer 70. Further, the horizontal portion of the second semiconductor channel layer 602L located above the top surface of the insulating cap layer 70 can be removed by a planarization process, which can employ a recess etch or chemical mechanical planarization (CMP). Each remaining portion of the second semiconductor channel layer 602L within a memory opening constitutes a second semiconductor channel portion 602.

Each adjoining pair of a first semiconductor channel portion 601 and a second semiconductor channel portion 602 can collectively form a semiconductor channel 60 through which electrical current can flow when a vertical NAND device including the semiconductor channel 60 is turned on. A tunneling dielectric 506 is embedded within a charge storage element 504, and laterally surrounds a portion of the semiconductor channel 60. Each adjoining set of a first blocking dielectric 501, a second blocking dielectric 503, a charge storage element 504, and a tunneling dielectric 506 collectively constitute a memory film 50, which can store electrical charges with a macroscopic retention time. In some embodiments, a first blocking dielectric 501 and/or a second blocking dielectric 503 may not be present in the memory film 50 at this step, and a blocking dielectric may be subsequently formed after formation of backside recesses. As used herein, a macroscopic retention time refers to a retention time suitable for operation of a memory device as a permanent memory device such as a retention time in excess of 24 hours.

The top surface of the remaining portion of the dielectric core layer 62L can be further recessed within each memory opening, for example, by a recess etch to a depth that is located between the top surface of the insulating cap layer 70 and the bottom surface of the insulating cap layer 70. Each remaining portion of the dielectric core layer 62L constitutes a dielectric core 62.

Figure 2H:
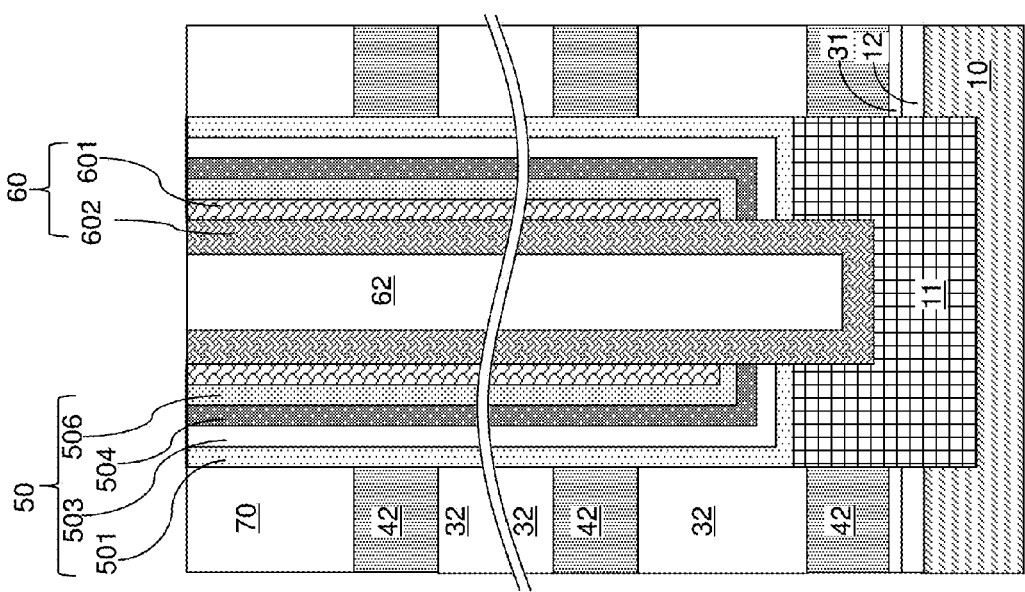

Referring to FIG. 2H, drain regions 63 can be formed by depositing a doped semiconductor material within each recessed region above the dielectric cores 62. The doped semiconductor material can be, for example, doped polysilicon formed by at least one of in-situ doping and ion implantation doping or a combination thereof. The highly doped drain regions near the drain side select gates provide a low resistive contact region for a bit line connection. Excess portions of the deposited semiconductor material can be removed from above the top surface of the insulating cap layer 70, for example, by chemical mechanical planarization (CMP) or a recess etch to form the drain regions 63.

Figure 3:
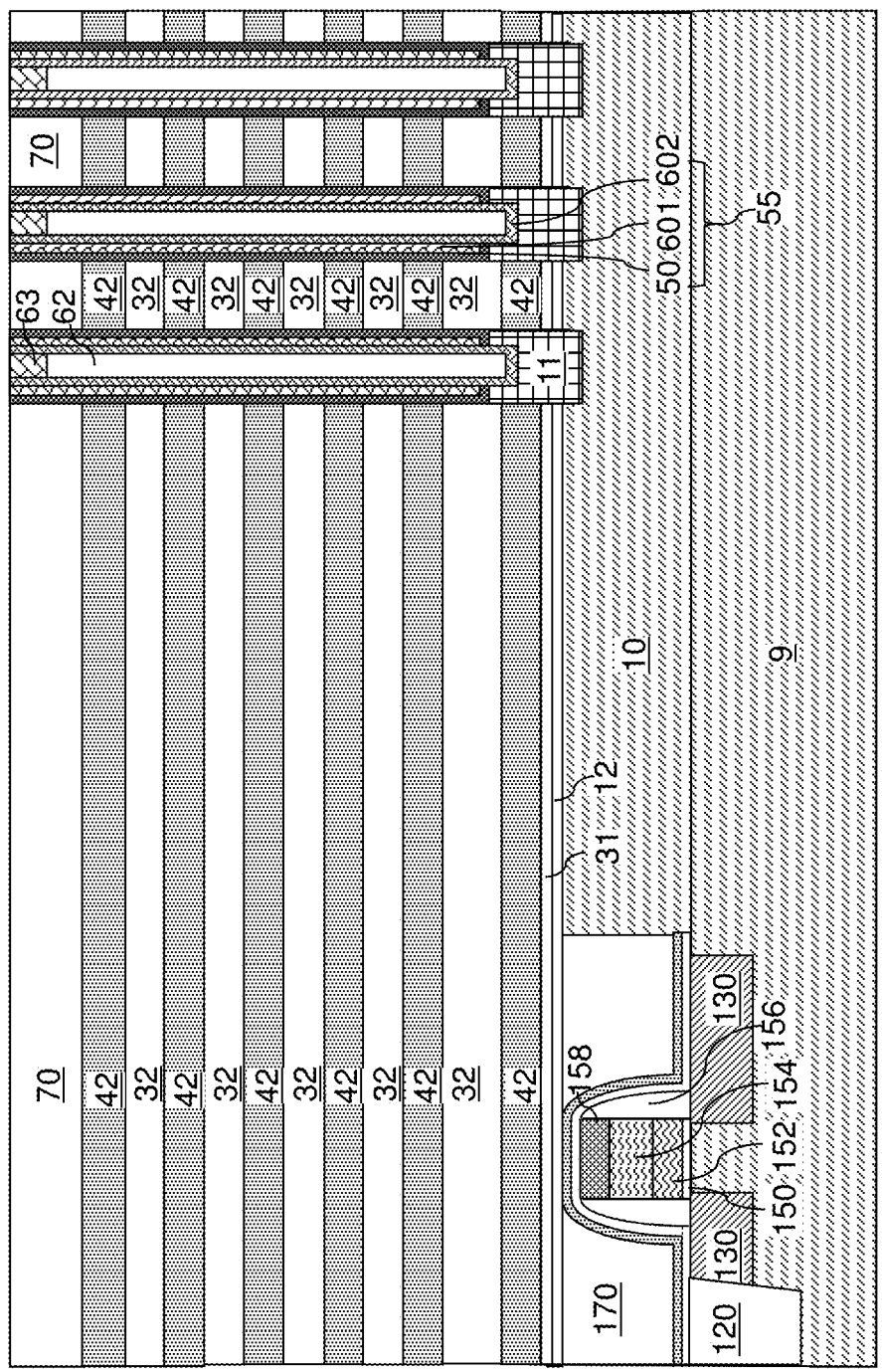
FIG. 3 is a vertical cross-sectional view of the first exemplary structure after formation of memory stack structures according to the first embodiment of the present disclosure.

The exemplary memory stack structure can be embedded into the first exemplary structure illustrated in FIG. 1. FIG. 3 illustrates the first exemplary structure that incorporates multiple instances of the exemplary memory stack structure of FIG. 2F. The first exemplary structure includes a semiconductor device, which comprises a stack (32, 42) including an alternating plurality of material layers (e.g., the sacrificial material layers 42) and insulating layers 32 located over a semiconductor substrate (9, 10), and a memory opening extending through the stack (32, 42). The semiconductor device further comprises a first blocking dielectric 501 vertically extending from a bottommost layer (e.g., the bottommost sacrificial material layer 42) of the stack to a topmost layer (e.g., the topmost sacrificial material layer 42) of the stack, and contacting a sidewall of the memory opening and a horizontal surface of the semiconductor substrate. While the present disclosure is described employing the illustrated configuration for the memory stack structure, the methods of the present disclosure can be applied to alternative memory stack structures including a polycrystalline semiconductor channel.

Figure 4:
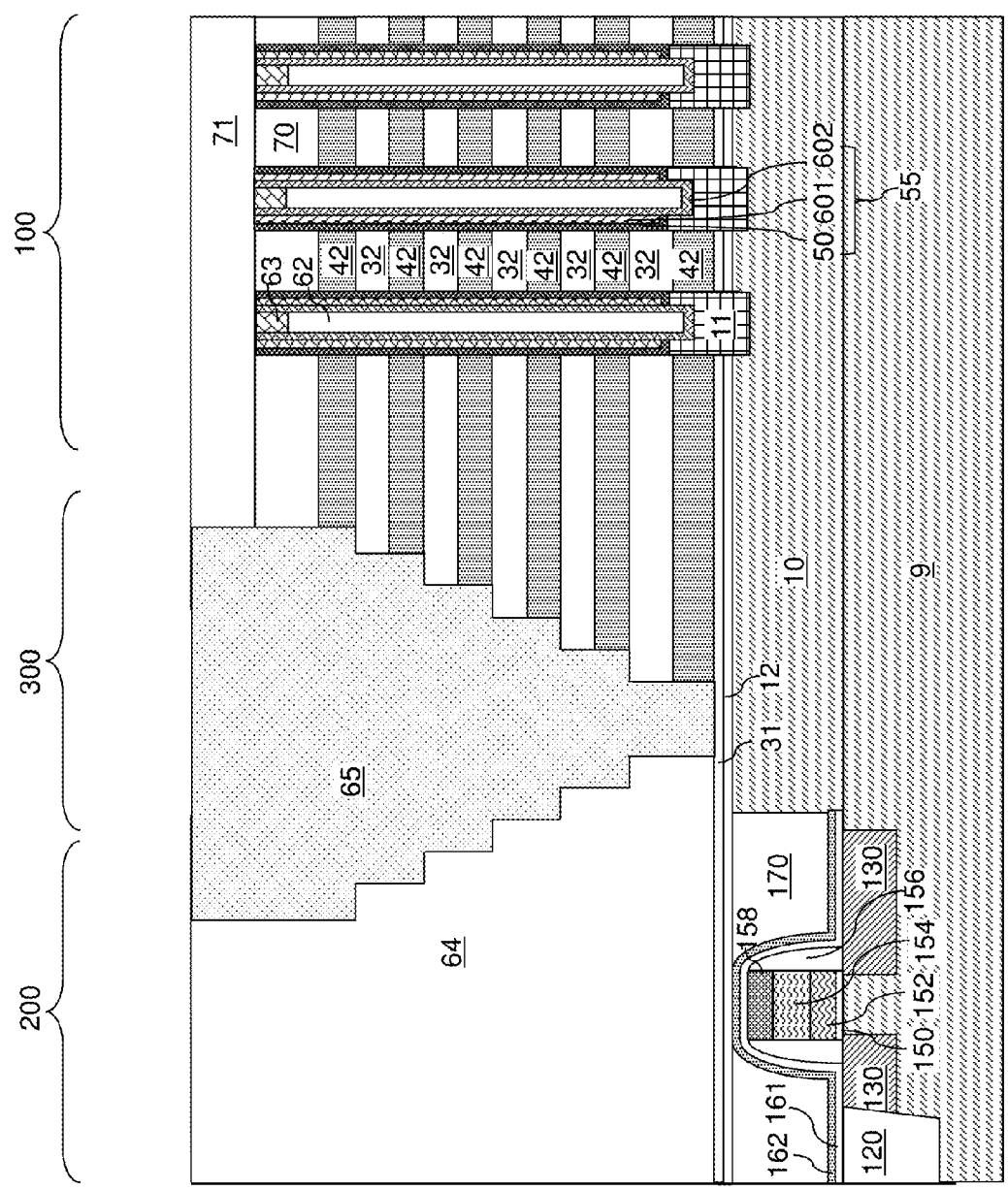
FIG. 4 is a vertical cross-sectional view of the first exemplary structure after formation of a stepped terrace and a retro-stepped dielectric material portion according to the first embodiment of the present disclosure.

Referring to FIG. 4, an optional first contact level dielectric layer 71 can be formed over the substrate (9, 10). As an optional structure, the first contact level dielectric layer 71 may, or may not, be formed. In case the first contact level dielectric layer 71 is formed, the first contact level dielectric layer 71 includes a dielectric material such as silicon oxide, silicon nitride, silicon oxynitride, porous or non-porous organosilicate glass (OSG), or a combination thereof. If an organosilicate glass is employed, the organosilicate glass may, or may not, be doped with nitrogen. The first contact level dielectric layer 71 can be formed over a horizontal plane including the top surface of the insulating cap layer 70 and the top surfaces of the drain regions 63. The first contact level dielectric layer 71 can be deposited by chemical vapor deposition, atomic layer deposition (ALD), spin-coating, or a combination thereof. The thickness of the first contact level dielectric layer 71 can be in a range from 10 nm to 300 nm, although lesser and greater thicknesses can also be employed.

In one embodiment, the first contact level dielectric layer 71 can be formed as a dielectric material layer having a uniform thickness throughout. The first contact level dielectric layer 71 may be formed as a single dielectric material layer, or can be formed as a stack of a plurality of dielectric material layers. Alternatively, formation of the first contact level dielectric layer 71 may be merged with formation of at least one line level dielectric layer (not shown). While the present disclosure is described employing an embodiment in which the first contact level dielectric layer 71 is a structure separate from an optional second contact level dielectric layer or at least one line level dielectric layer to be subsequently deposited, embodiments in which the first contact level dielectric layer 71 and at least one line level dielectric layer are formed at a same processing step, and/or as a same material layer, are expressly contemplated herein.

Optionally, a portion of the alternating stack (32, 42) can be removed, for example, by applying and patterning a photoresist layer with an opening and by transferring the pattern of the opening through the alternating stack (32, 42) employing an etch such as an anisotropic etch. An optional trench extending through the entire thickness of the alternating stack (32, 42) can be formed within an area that includes a peripheral device region 200 and a portion of a contact region 300, which is adjacent to a device region 100 that includes an array of memory stack structures 55. Subsequently, the trench can be filled with an optional dielectric material such as silicon oxide. Excess portions of the dielectric material can be removed from above the top surface of the first contact level dielectric layer 71 by a planarization process such as chemical mechanical planarization and/or a recess etch. The top surfaces of the first contact level dielectric layer 71 can be employed as a stopping surface during the planarization. The remaining dielectric material in the trench constitutes a dielectric material portion 64.

A stepped cavity can be formed within the contact region 300, which can straddle the dielectric material portion 64 and a portion of the alternating stack (32, 42). Alternatively, the dielectric material portion 64 may be omitted and the stepped cavity 69 may be formed directly in the stack (32, 42). The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

The dielectric material portion 64 can have stepped surfaces after formation of the stepped cavity, and a peripheral portion of the alternating stack (32, 42) can have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A retro-stepped dielectric material portion 65 (i.e., an insulating fill material portion) can be formed in the stepped cavity by deposition of a dielectric material therein. A dielectric material such as silicon oxide can be deposited in the stepped cavity. Excess portions of the deposited dielectric material can be removed from above the top surface of the first contact level dielectric layer 71, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Figure 5A:
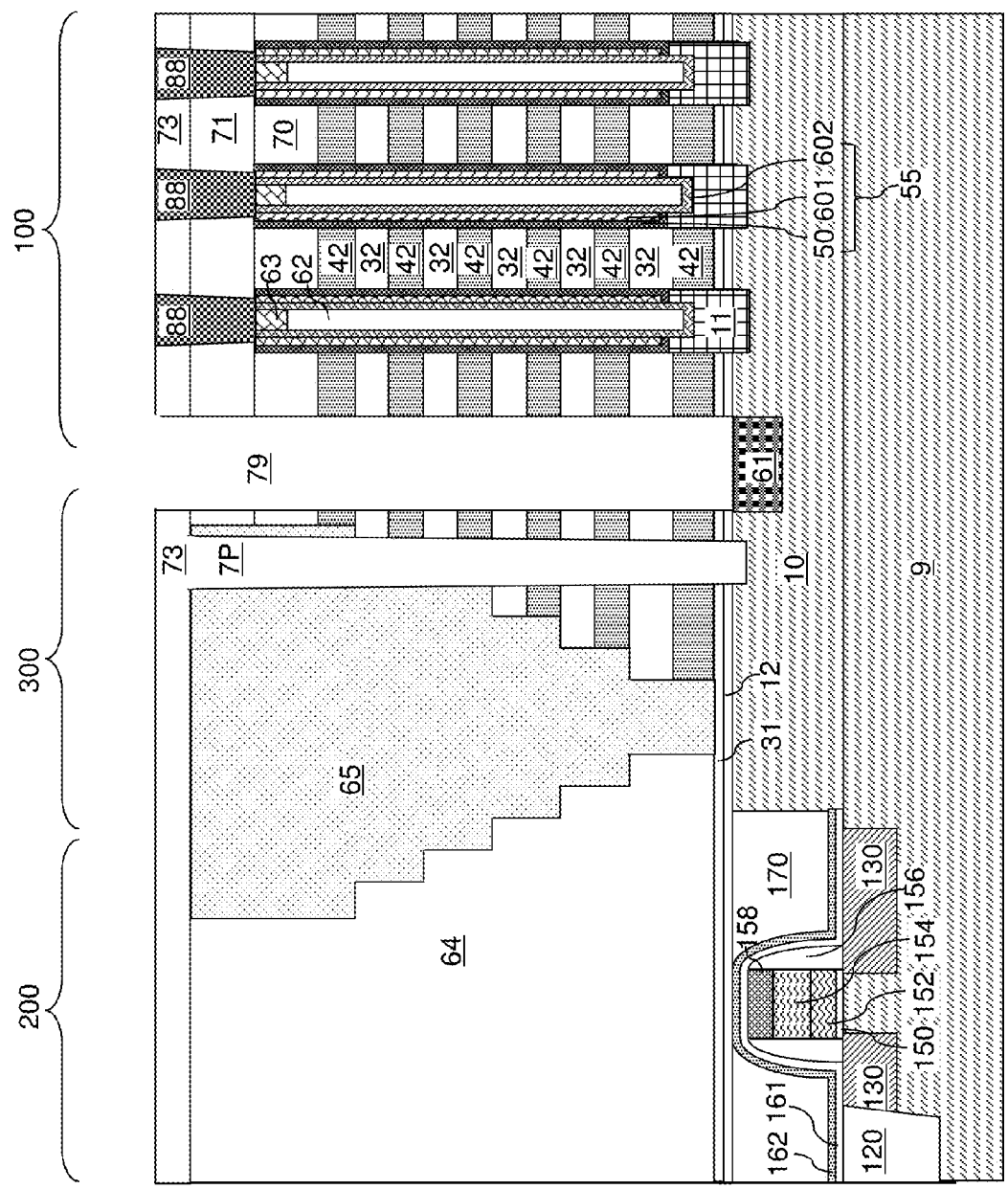
FIG. 5A is a vertical cross-sectional view of the first exemplary structure after formation of a backside contact trench according to the first embodiment of the present disclosure.
Figure 5B:
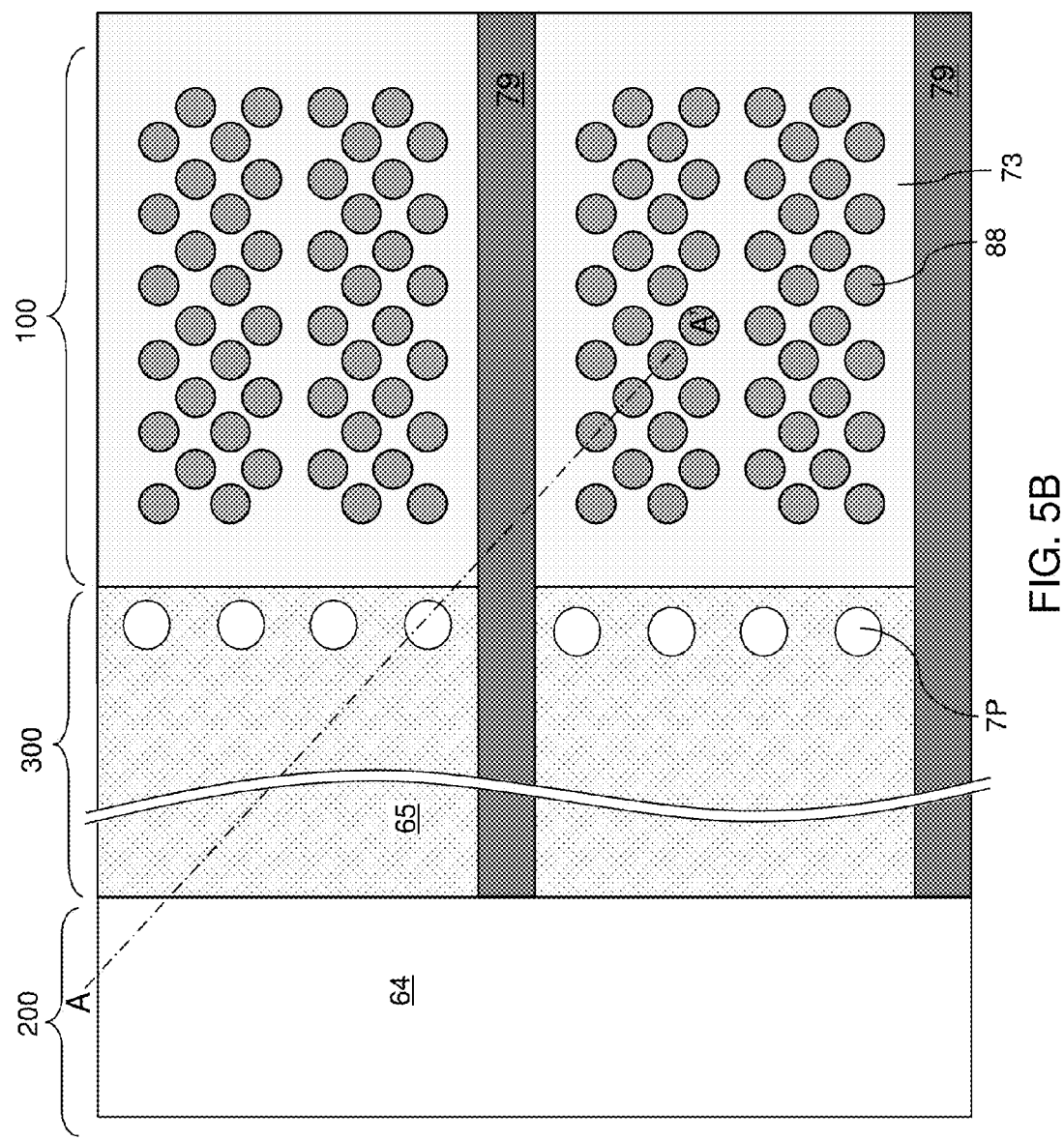
FIG. 5B is a partial see-through top-down view of the first exemplary structure of FIG. 5A. The vertical plane A-A' is the plane of the vertical cross-sectional view of FIG. 5A.

Referring to FIGS. 5A and 5B, at least one dielectric support pillar 7P may be optionally formed through the retro-stepped dielectric material portion 65 and/or through the first contact level dielectric layer 71 and/or through the alternating stack (32, 42). The plane A-A' in FIG. 5B corresponds to the plane of the vertical cross-sectional view of FIG. 5A. In one embodiment, the at least one dielectric support pillar 7P can be formed in the contact region 300, which is located adjacent to the device region 100. The at least one dielectric support pillar 7P can be formed, for example, by forming an opening extending through the retro-stepped dielectric material portion 65 and/or through the alternating stack (32, 42) and at least to the top surface of the substrate (9, 10), and by filling the opening with a dielectric material that is resistant to the etch chemistry to be employed to remove the sacrificial material layers 42.

In one embodiment, the at least one dielectric support pillar can include silicon oxide and/or a dielectric metal oxide such as aluminum oxide. In one embodiment, the portion of the dielectric material that is deposited over the first contact level dielectric layer 71 concurrently with deposition of the at least one dielectric support pillar 7P can be present over the first contact level dielectric layer 71 as a second contact level dielectric layer 73. Each of the at least one dielectric support pillar 7P and the second contact level dielectric layer 73 is an optional structure. As such, the second contact level dielectric layer 73 may, or may not, be present over the insulating cap layer 70 and the retro-stepped dielectric material portion 65. The first contact level dielectric layer 71 and the second contact level dielectric layer 73 are herein collectively referred to as at least one contact level dielectric layer (71, 73). In one embodiment, the at least one contact level dielectric layer (71, 73) can include both the first and second contact level dielectric layers (71, 73), and optionally include any additional via level dielectric layer that can be subsequently formed. In another embodiment, the at least one contact level dielectric layer (71, 73) can include only the first contact level dielectric layer 71 or the second contact level dielectric layer 73, and optionally include any additional via level dielectric layer that can be subsequently formed. Alternatively, formation of the first and second contact level dielectric layers (71, 73) may be omitted, and at least one via level dielectric layer may be subsequently formed, i.e., after formation of a backside contact via structure.

The second contact level dielectric layer 73 and the at least one dielectric support pillar 7P can be formed as a single contiguous structure of integral construction, i.e., without any material interface therebetween. In another embodiment, the portion of the dielectric material that is deposited over the first contact level dielectric layer 71 concurrently with deposition of the at least one dielectric support pillar 7P can be removed, for example, by chemical mechanical planarization or a recess etch. In this case, the second contact level dielectric layer 73 is not present, and the top surface of the first contact level dielectric layer 71 can be physically exposed.

Memory contact via structures 88 can be formed through the first and second contact level dielectric layers (73, 71). Specifically, a photoresist layer can be applied over the second contact level dielectric layer 73, and can be lithographically patterned to form openings overlying the drain structures 63. An anisotropic etch can be performed to transfer the pattern in the photoresist layer through the first and second contact level dielectric layers (73, 71) to form memory contact via cavities that extend through the first and second contact level dielectric layers (73, 71). The memory contact via cavities can be filled with at least one conductive material. Excess portions of the at least one conductive material can be removed from above a horizontal plane including a top surface of the second contact level dielectric layer 73. Each remaining contiguous portion of the at least one conductive material constitutes a memory contact via structure 88, which contacts a top surface of an underlying drain region 63. The photoresist layer can be subsequently removed, for example, by ashing.

Another photoresist layer (not shown) can be applied over the alternating stack (32, 42) and/or the retro-stepped dielectric material portion 65, and lithographically patterned to form at least one backside contact trench 79 in an area in which formation of a backside contact via structure is desired. The trench 79 may extend through region 100 or through both regions 100 and 300. The pattern in the photoresist layer can be transferred through the alternating stack (32, 42) and/or the retro-stepped dielectric material portion 65 employing an anisotropic etch to form the at least one backside contact trench 79, which extends at least to the top surface of the substrate (9, 10). In one embodiment, the at least one backside contact trench 79 can include a source contact opening in which a source contact via structure can be subsequently formed.

A source region 61 can be formed in a surface portion of the substrate (e.g., in the semiconductor material layer 10) underneath the backside contact trench 79. A source region 61 can be formed by implanting electrical dopants through each backside contact trench 79 into a semiconductor portion located on, or within, the substrate (9, 10). For example, a source region 61 may be formed by implantation of dopant atoms into a portion of the semiconductor material layer 10 through each backside contact trench 79. Alternatively, a source region 61 can be formed on the substrate (9, 10) as a doped semiconductor portion by deposition of a semiconductor material, for example, by selective epitaxy, and by implantation of electrical dopants into the deposited semiconductor portion.

Figure 6:
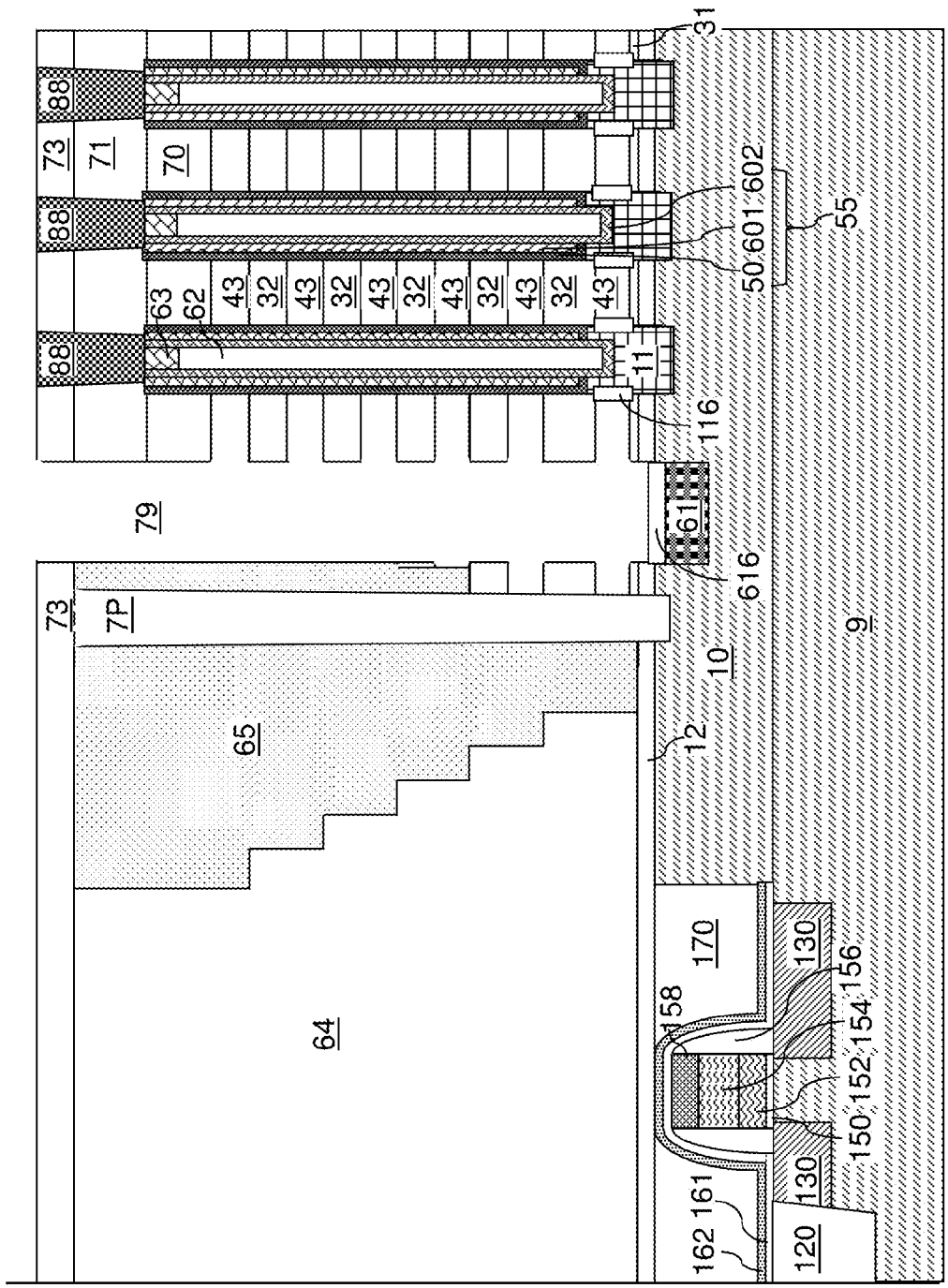
FIG. 6 is a vertical cross-sectional view of the first exemplary structure after formation of backside recesses according to the first embodiment of the present disclosure.

Referring to FIG. 6, an etchant that selectively etches the second material of the sacrificial material layers 42 with respect to the first material of the insulating layers 32 can be introduced into the at least one backside contact trench 79, for example, employing an etch process. Backside recesses 43 are formed in volumes from which the sacrificial material layers 42 are removed. The removal of the second material of the sacrificial material layers 42 can be selective to the first material of the insulating layers 32, the material of the at least one dielectric support pillar 7P, the material of the retro-stepped dielectric material portion 65, the semiconductor material of the semiconductor material layer 10, and the material of the outermost layer of the memory films 50.

In one embodiment, the sacrificial material layers 42 can include silicon nitride, and the materials of the insulating layers 32, the at least one dielectric support pillar 7P, and the retro-stepped dielectric material portion 65 can be selected from silicon oxide and dielectric metal oxides. In another embodiment, the sacrificial material layers 42 can include a semiconductor material such as polysilicon, and the materials of the insulating layers 32, the at least one dielectric support pillar 7P, and the retro-stepped dielectric material portion 65 can be selected from silicon oxide, silicon nitride, and dielectric metal oxides. In this case, the depth of the at least one backside contact trench 79 can be modified so that the bottommost surface of the at least one backside contact trench 79 is located within the dielectric pad layer 12, i.e., to avoid physical exposure of the top surface of the semiconductor substrate layer 10.

The etch process that removes the second material selective to the first material and the outermost layer of the memory films 50 can be a wet etch process employing a wet etch solution, or can be a gas phase (dry) etch process in which the etchant is introduced in a vapor phase into the at least one backside contact trench 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The at least one dielectric support pillar 7P, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side recesses or front side cavities in contrast with the backside recesses 43. In one embodiment, the device region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout. Optionally, a backside blocking dielectric layer can be formed in the backside recesses.

Physically exposed surface portions of the optional epitaxial channel portions 11 and the source regions 61 can be converted into dielectric material portions by thermal conversion and/or plasma conversion of the semiconductor materials into dielectric materials. For example, thermal conversion and/or plasma conversion can be employed to convert a surface portion of each epitaxial channel portion 11 into a dielectric spacer 116, and to convert a surface portion of each source region 61 into a sacrificial dielectric portion 616. In one embodiment, each dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The dielectric spacers 116 include a dielectric material that includes the same semiconductor element as the epitaxial channel portions 11 and additionally includes at least one non-metallic element such as oxygen and/or nitrogen such that the material of the dielectric spacers 116 is a dielectric material. In one embodiment, the dielectric spacers 116 can include a dielectric oxide, a dielectric nitride, or a dielectric oxynitride of the semiconductor material of the epitaxial channel portions 11. Likewise, each sacrificial dielectric portion 616 includes a dielectric material that includes the same semiconductor element as the source regions 61 and additionally includes at least one non-metallic element such as oxygen and/or nitrogen such that the material of the sacrificial dielectric portions 616 is a dielectric material. In one embodiment, the sacrificial dielectric portions 616 can include a dielectric oxide, a dielectric nitride, or a dielectric oxynitride of the semiconductor material of the source region 61.

Figure 7:
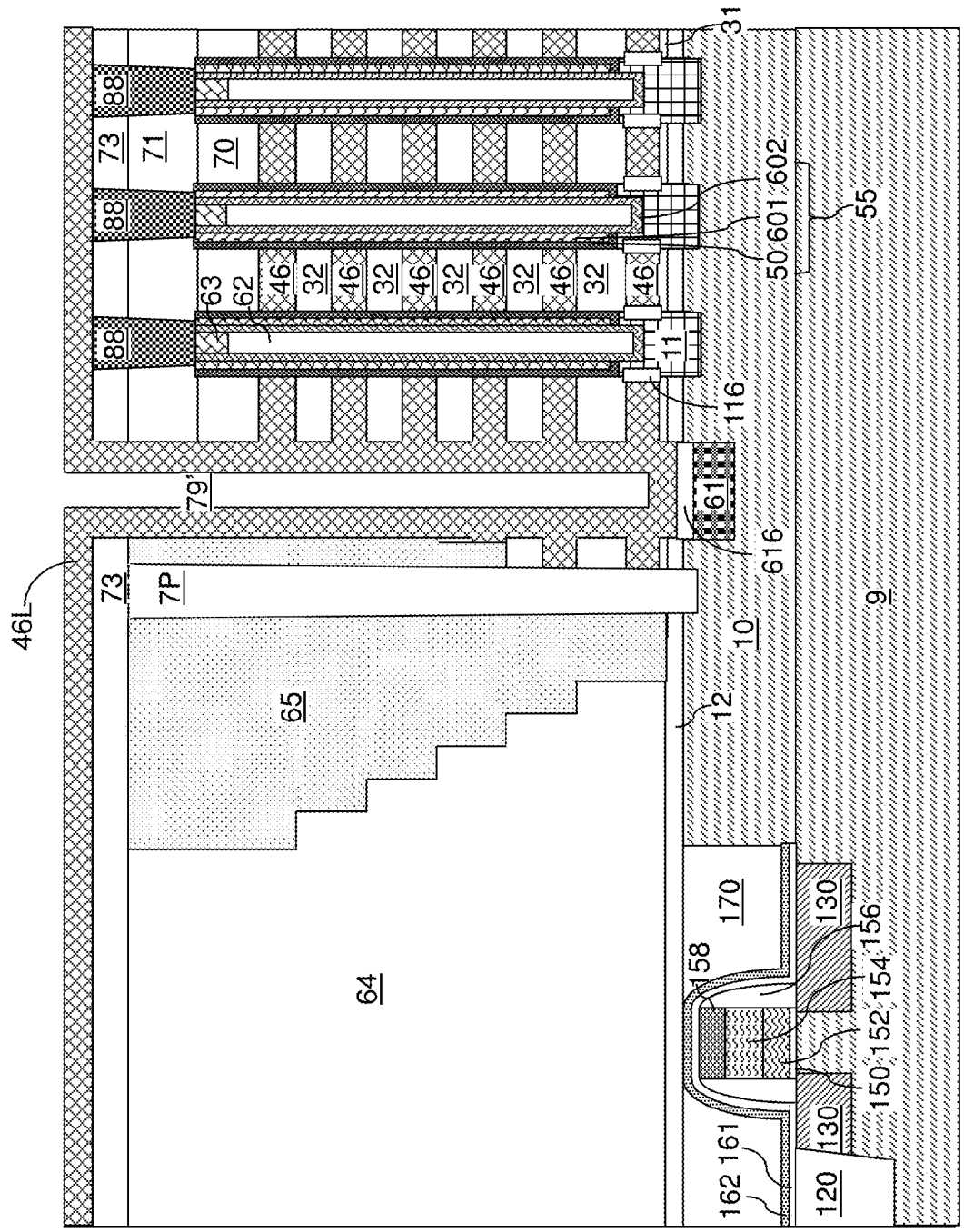
FIG. 7 is a vertical cross-sectional view of the first exemplary structure after formation of electrically conductive layers according to the first embodiment of the present disclosure.

Referring to FIG. 7, a backside blocking dielectric layer (not shown) can be optionally formed. The backside blocking dielectric layer, if present, comprises a dielectric material that functions as a control gate dielectric for the control gates to be subsequently formed in the backside recesses 43. In case a blocking dielectric 502 is present within each memory opening, the backside blocking dielectric layer is optional. In case a blocking dielectric layer 502 is omitted, the backside blocking dielectric layer is present.

At least one metallic material can be deposited in the plurality of backside recesses 43, on the sidewalls of the at least one the backside contact trench 79, and over the top surface of the second contact level dielectric layer 73. As used herein, a metallic material refers to an electrically conductive material that includes at least one metallic element.

The metallic material can be deposited by a conformal deposition method, which can be, for example, chemical vapor deposition (CVD), atomic layer deposition (ALD), electroless plating, electroplating, or a combination thereof. The metallic material can be an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof. Non-limiting exemplary metallic materials that can be deposited in the plurality of backside recesses 43 include tungsten, tungsten nitride, titanium, titanium nitride, tantalum, tantalum nitride, cobalt, and ruthenium. In one embodiment, the metallic material can comprise a metal such as tungsten and/or metal nitride. In one embodiment, the metallic material for filling the plurality of backside recesses 43 can be a combination of titanium nitride layer and a tungsten fill material.

In one embodiment, the metallic material can be deposited by chemical vapor deposition or atomic layer deposition. In one embodiment, the metallic material can be employing at least one fluorine-containing precursor gas as a precursor gas during the deposition process. In one embodiment, the molecule of the at least one fluorine-containing precursor gas cam comprise a compound of at least one tungsten atom and at least one fluorine atom. For example, if the metallic material includes tungsten, $WF_6$ and $H_2$ can be employed during the deposition process.

A plurality of electrically conductive layers 46 can be formed in the plurality of backside recesses 43, and a contiguous metallic material layer 46L can be formed on the sidewalls of each backside contact trench 79 and over the at least one contact level dielectric layer (71,73). Thus, each sacrificial material layer 42 can be replaced with an electrically conductive layer 46. A backside cavity 79' is present in the portion of each backside contact trench 79 that is not filled with the backside blocking dielectric layer 66 and the contiguous metallic material layer 46L.

Figure 8:
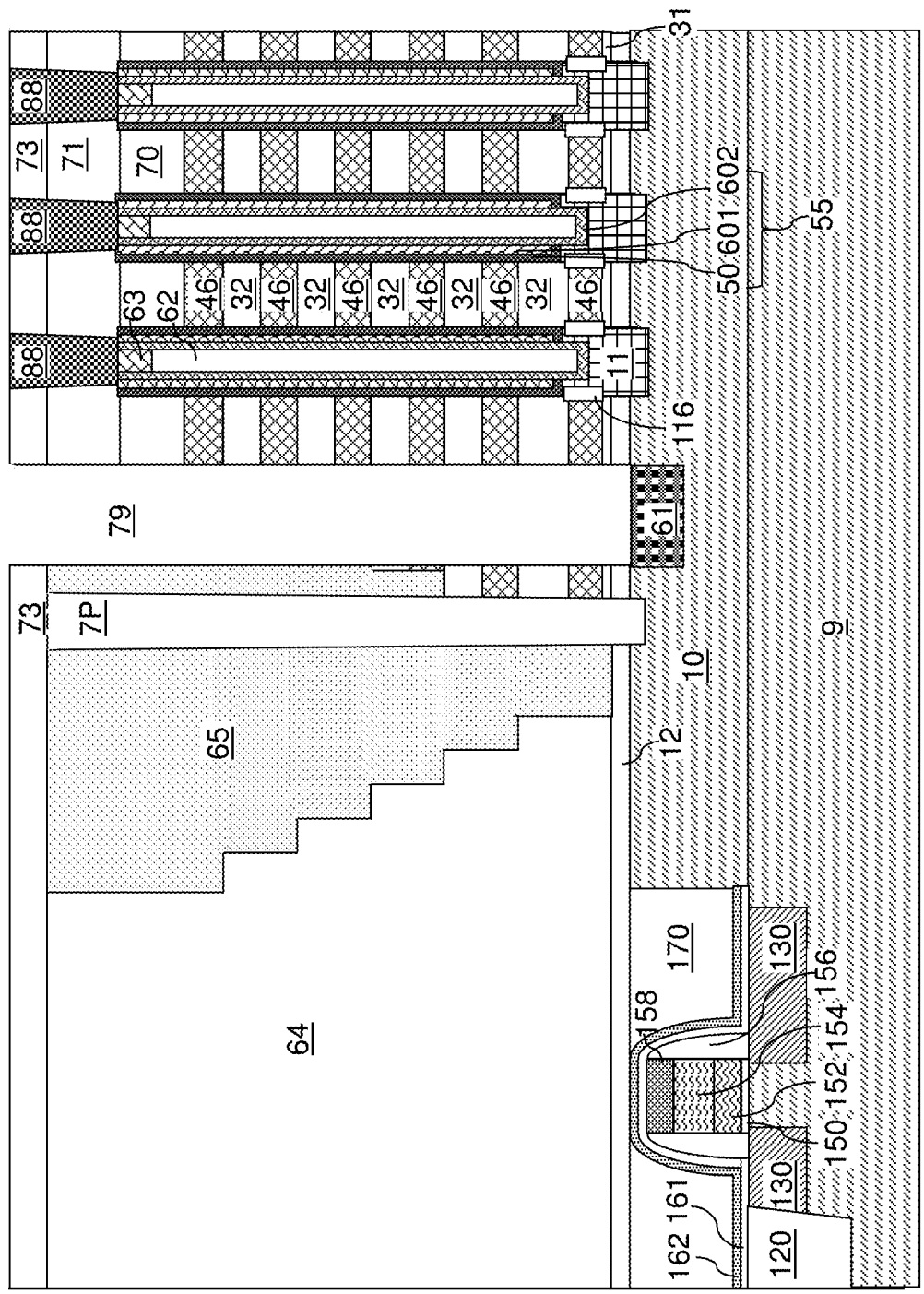
FIG. 8 is a vertical cross-sectional view of the first exemplary structure after removal of a deposited conductive material from within the backside contact trench according to the first embodiment of the present disclosure.

Referring to FIG. 8, the deposited metallic material of the contiguous metallic material layer 46L is etched back from the sidewalls of each backside contact trench 79 and from above the second contact level dielectric layer 73, for example, by an isotropic wet etch or dry etch or the combination of isotropic wet etch and dry etch. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46.

Each electrically conductive layer 46 can function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 can be a word line that functions as a common control gate electrode for the plurality of vertical memory devices. Optionally, the sacrificial dielectric portions 616 can be removed from above the source regions 61 during the last processing step of the anisotropic etch.

Figure 9:
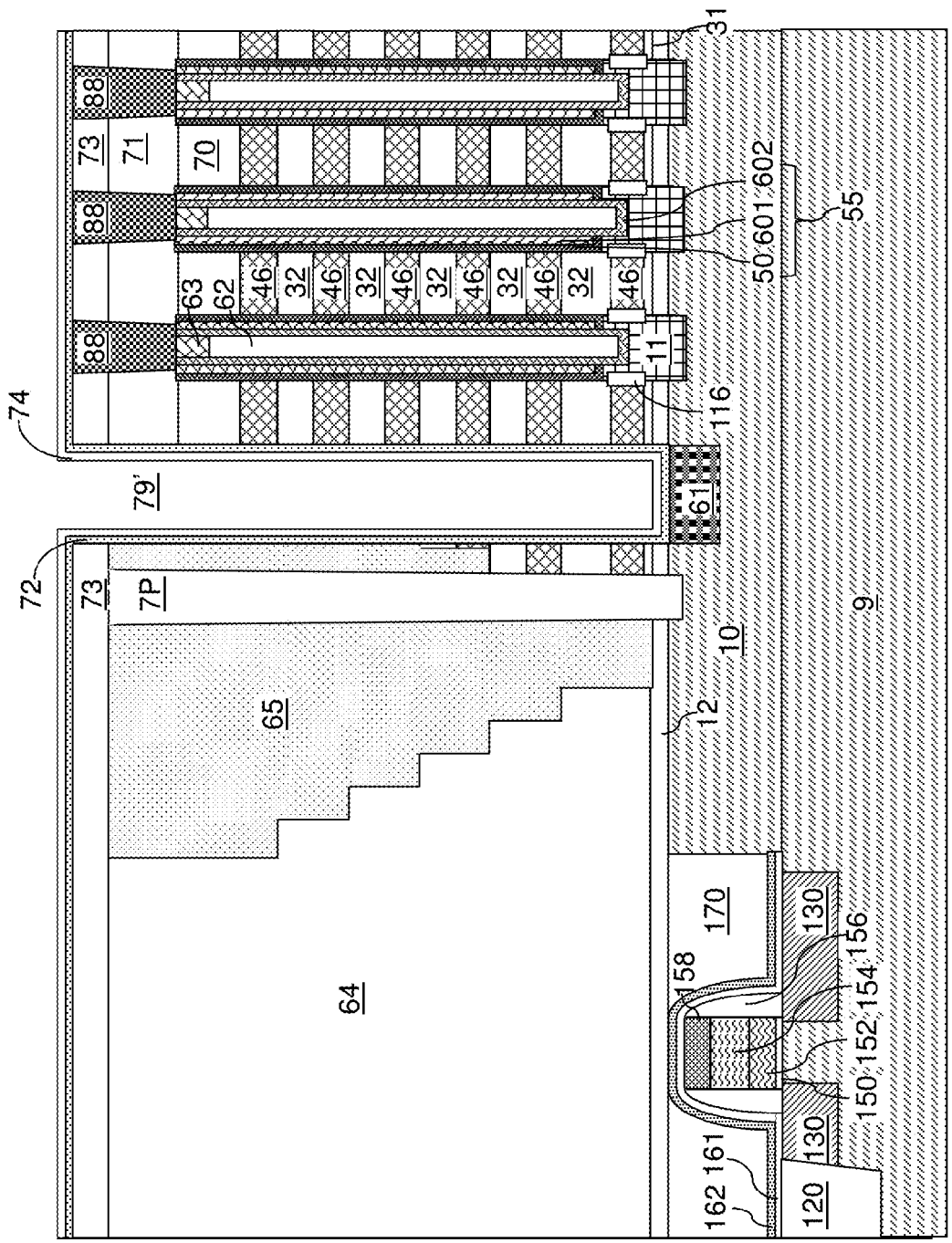
FIG. 9 is a vertical cross-sectional view of the first exemplary structure after formation of a stack of a silicon nitride layer and a silicon oxide layer according to the first embodiment of the present disclosure.

Referring to FIG. 9, a silicon nitride layer 72 and a silicon oxide layer 74 are sequentially deposited to form a stack of the silicon nitride layer 72 and the silicon oxide layer 74. The silicon nitride layer 74 can be deposited on the sidewalls of the backside contact trench 79, e.g., on the sidewalls electrically conductive layers 46 at the periphery of the backside contact trench 79. The silicon nitride layer 72 can be deposited by a conformal deposition process such as chemical vapor deposition (CVD) or atomic layer deposition (ALD). In one embodiment, dichlorosilane (DCS) or silane can be employed as a silicon-containing precursor gas, and ammonia can be employed as a nitrogen-containing precursor gas. The thickness of the silicon nitride layer 72 can be in a range from 1 nm to 30 nm, although lesser and greater thicknesses can also be employed.

The silicon oxide layer 74 can be deposited by a conformal deposition process such as chemical vapor deposition or atomic layer deposition. In one embodiment, tetraorthosilicate (TEOS) can be employed as a silicon-containing precursor in a chemical vapor deposition process. In case an atomic layer deposition process is employed, (N,N-dimethylamino)trimethylsilane (having the chemical formula of $(CH_3)_3SiN(CH_3)_2$), vinyltrimethoxysilane (having the chemical formula of $CH_2\!\!=\!\!CHSi(OCH_3)_3$), trivinylmethoxysilane (having the chemical formula of $(CH_2\!\!=\!\!CH)_3SiOCH_3$), tetrakis(dimethylamino)silane (having the chemical formula of $Si(N(CH_3)_2)_4$), or tris(dimethylamino) silane (TDMAS, having the chemical formula of $SiH(N(CH_3)_2)_3$) may be employed as a silicon-containing precursor, and an oxidant gas (such as oxygen or $H_2O$) can be employed. The silicon oxide layer 74 may, or may not, be doped with at least one element. Thus, the silicon oxide layer 74 can comprise a material selected from doped silicate glass and undoped silicate glass (such as borosilicate glass, phosphosilicate glass, borophosphosilicate glass, or organosilicate glass). The silicon oxide layer 74 may be optionally doped with nitrogen to block diffusion of metallic elements therethrough.

The thickness of the silicon oxide layer 74 can be in a range from 1 nm to 30 nm, although lesser and greater thicknesses can be employed. The thickness of the stack of the silicon nitride layer 72 and the silicon oxide layer 74 can be in a range from 3 nm to 60 nm, although lesser and greater thicknesses can also be employed. A backside cavity 79' is present in the volume of the backside contact trench 79 that is not filled with the stack of the silicon nitride layer 72 and the silicon oxide layer 74.

Figure 10:
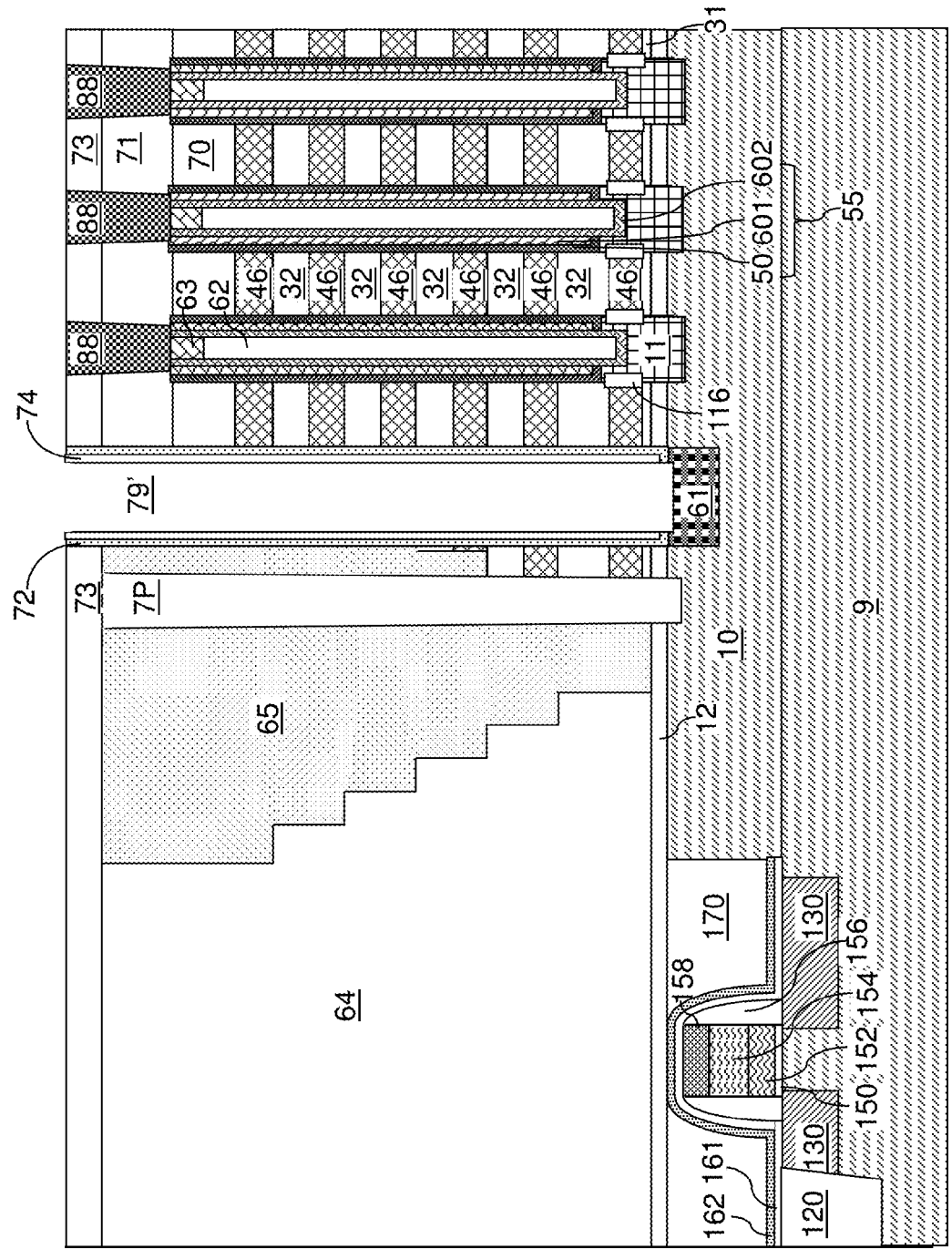
FIG. 10 is a vertical cross-sectional view of the first exemplary structure after formation of an insulating spacer according to the first embodiment of the present disclosure.

Referring to FIG. 10, horizontal portions of dielectric materials of the silicon nitride layer 72 and the silicon oxide layer 74 can be anisotropically etched. Specifically, an anisotropic etch process can be performed to remove horizontal portions of the silicon nitride layer 72 and the silicon oxide layer 74 from above the top surface of the at least one contact level dielectric layer (71, 73) and from the bottom region of the backside contact trench 79. Remaining vertical portions of the silicon nitride layer 72 and the silicon oxide layer 74 within the backside contact trench 29 constitute an insulating spacer (72, 74). The insulating spacer (72, 74) can be topologically homeomorphic to a torus. In one embodiment, an annular bottom surface of the insulating spacer (72, 74) can contact a top surface of the source region 61. The insulating spacer (72, 74) can extend from the top surface of the at least one contact level dielectric layer (71, 73) to the top surface of the substrate (9, 10).

Figure 11:
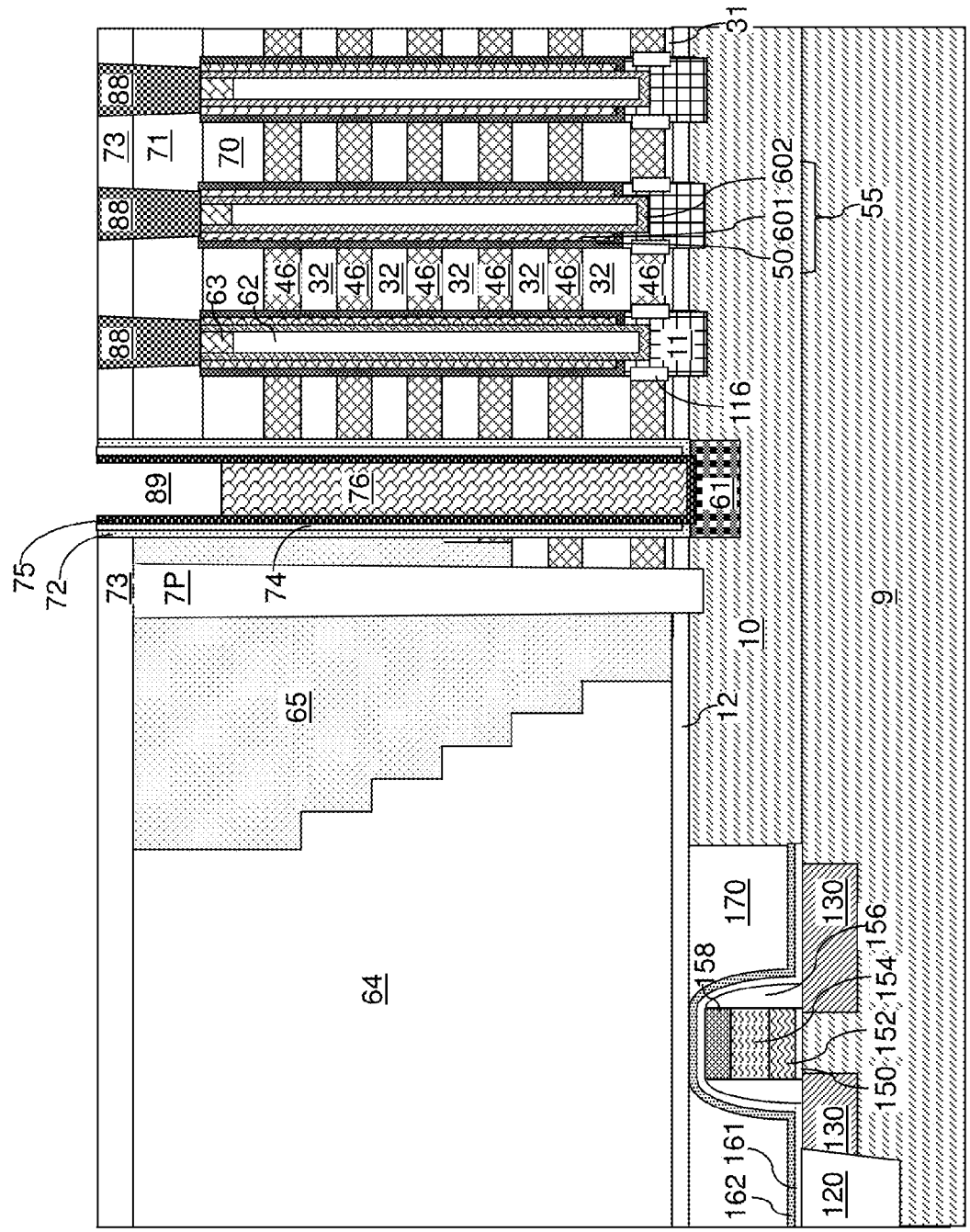
FIG. 11 is a vertical cross-sectional view of the first exemplary structure after formation of a first conductive liner and a first conductive material portion according to the first embodiment of the present disclosure.

Referring to FIG. 11, a first conductive liner 75 can be deposited on the insulating spacer (72, 74) and over the at least one contact level dielectric layer (71, 73). The first conductive liner 75 can comprise a conductive diffusion barrier material such as a metallic nitride. Exemplary metallic nitrides comprise titanium nitride, tantalum nitride, and tungsten nitride. The first conductive liner 75 can be deposited by chemical vapor deposition (CVD) or physical vapor deposition (PVD). The thickness of the first conductive liner 75 can be in a range from 1 nm to 30 nm, although lesser and greater thicknesses can also be employed.

A first conductive fill material can be deposited in the cavity within the first conductive liner 75, i.e., the portion of the backside contact trench 79 that is not filled within the first conductive liner 75. The first conductive fill material can be deposited by a conformal deposition process (such as chemical vapor deposition) and fill the cavity within the backside contact trench 79. In one embodiment, the first conductive fill material comprises a heavily or degenerately doped semiconductor material that is conductive, i.e., having electrical conductivity greater than $1.0\times10^5$ S/cm. The doped semiconductor material can be p-doped or n-doped, and can comprise at least one elemental semiconductor material (such as polysilicon or a silicon-germanium alloy), or can comprise a compound semiconductor material (such as a III-V compound semiconductor material). The first conductive fill material can completely fill the cavity in the backside contact trench 79.

The first conductive fill material can be subsequently etched back, for example, by an isotropic etch process or an anisotropic etch process. A recessed region 89 can be formed in an upper portion of the backside contact trench 79 from which the first conductive fill material is removed. In one embodiment, the depth of the recessed region can be in a range from 5% to 40% of the height of the backside contact trench 79 through the alternating stack (32, 46), the insulating cap layer 70, and the at least one contact level dielectric layer (71, 73). The remaining portion of the first conductive fill material in the backside contact trench constitutes a first conductive material portion 76, which can comprise a doped semiconductor material. The horizontal portion of the first conductive liner 75 can be removed from above the at least one contact level dielectric layer (71, 73) during, or after, recessing of the first conductive fill material to form the recessed region 89.

Figure 12:
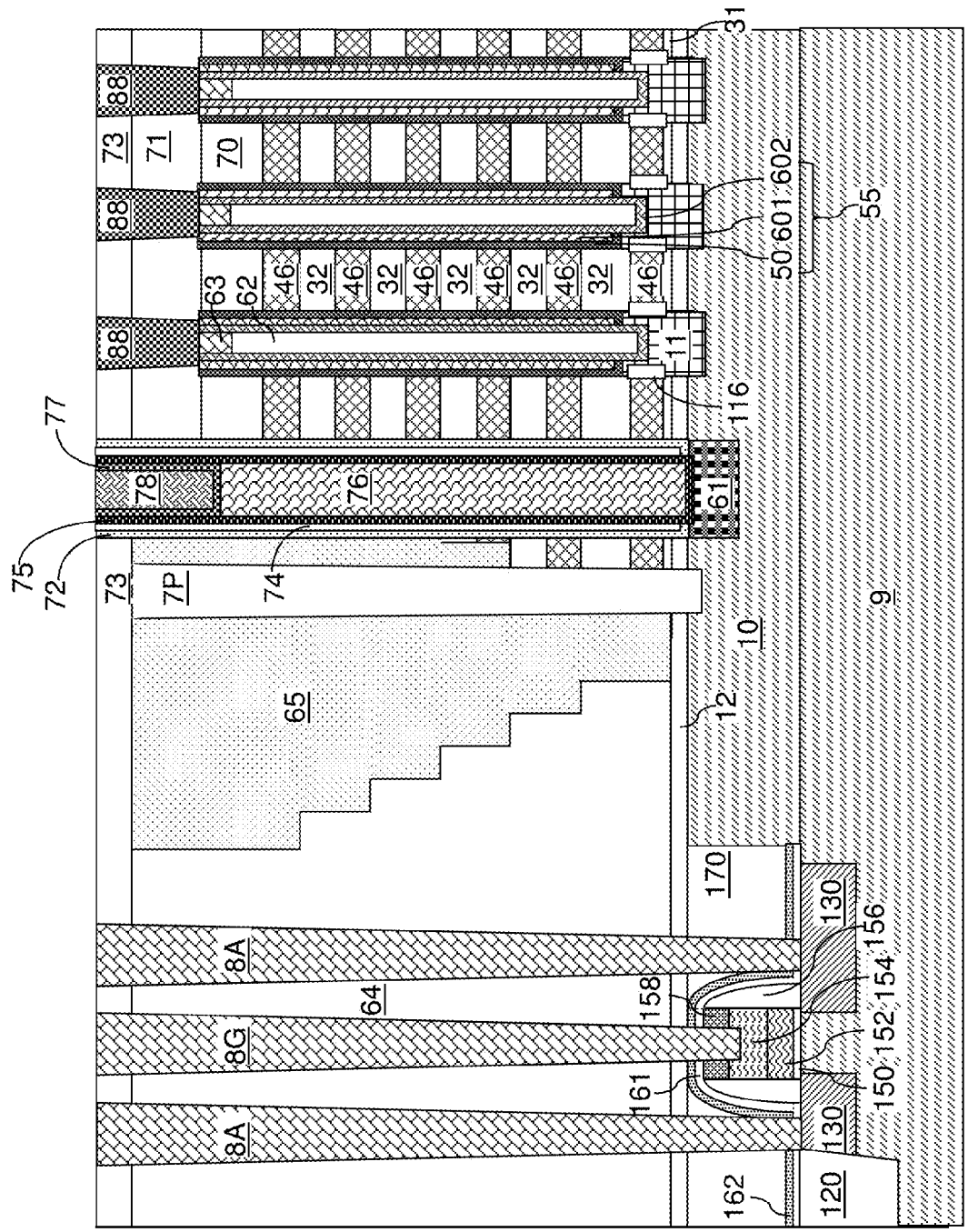
FIG. 12 is a vertical cross-sectional view of the first exemplary structure after formation of a second conductive liner and a second conductive material portion and additional contact via structures according to the first embodiment of the present disclosure.

Referring to FIG. 12, a second conductive liner 77 is deposited on the top surface of the lower conductive material portion 76 and in a peripheral portion of the recessed region 89. The second conductive liner 77 can be formed on the physically exposed surfaces of the outer metallic layer 75 and a topmost dielectric layer (such as the second contact level dielectric layer 73) of the first exemplary structure. In one embodiment, the second conductive liner 77 contacts the portion of the inner sidewalls of the outer metallic layer 75 within the backside contact trench 79 and above the top surface of the lower conductive material portion 76. The second conductive liner 77 can comprise a conductive diffusion barrier material such as a metallic nitride. Any material that can be employed for the outer metallic layer 75 can be employed for the second conductive liner 77. The second conductive liner 77 may comprise the same material as, or may comprise a material different from, the outer metallic layer 75. The thickness of the second conductive liner 77 can be in a range from 1 nm to 30 nm, although lesser and greater thicknesses can also be employed.

A second conductive material is deposited in the cavity within the sidewalls of the second conductive liner 77, i.e., the portion of the backside contact trench 79 that is not filled within the outer metallic layer 75, the lower conductive material portion 76, and the second conductive liner 77. The second conductive material can be deposited by a conformal deposition process and fill the cavity within the backside contact trench 79. The conductive material layer can be deposited, for example, by chemical vapor deposition or physical vapor deposition.

In one embodiment, the second conductive material comprises a metallic fill material including at least one metal element such as tungsten, ruthenium, cobalt, aluminum, or a combination thereof. In one embodiment, the metallic fill material comprises tungsten deposited by chemical vapor deposition or atomic layer deposition. The second conductive material can completely fill the cavity within the backside contact trench 79.

Portions of the second conductive material and the second conductive liner 77 located above the top surface of the topmost dielectric layer of the first exemplary structure (such as the second contact level dielectric layer 73) can be removed by a planarization process such as a recess etch, chemical mechanical planarization, or a combination thereof. Horizontal portions of the second conductive material and the second conductive liner 77 can be removed by a planarization process that employs the second contact level dielectric layer 73 as a stopping layer. The remaining portion of the second conductive material constitutes an upper conductive material portion 78, which can include a metallic fill material.

The first conductive liner 75, the lower conductive material portion 76, the second conductive liner 77, and the upper conductive material portion 78 collectively constitute a backside contact via structure {(75, 78) or (75, 76, 77, 78)}, which is a contact via structure electrically shorted to a portion of the substrate (9, 10) (e.g., to the source 61 in the substrate) and laterally surrounded by the insulating spacer (72, 74). Alternatively, portion 76 and liner 77 may be omitted and portion 78 fills the entire inner volume of liner 75 to form an alternative backside contact via structure (75, 78).

The insulating spacer (72, 74) comprises a silicon nitride layer 72 which functions as a diffusion barrier dielectric layer that prevents diffusion of fluorine atoms therethrough. Thus, if residual fluorine atoms are present in the electrically conductive layers 46, the residual fluorine atoms that are present in the electrically conductive layers 46 cannot diffuse through the insulating spacer (72, 74), and electrical shorts between adjacent layers 46 or between layers 46 and portion(s) (76, 78) caused by fluorine atom diffusion along the backside contact trench 79 can be avoided or reduced.

Subsequently, additional contact via structures (8G, 8A) can be formed through the dielectric material portion 64 to various electrically active components in a peripheral device region. For example, the additional contact via structures (8G, 8A) can include at least one gate contact via structure 8G and at least one active region contact via structure 8A. If desired, the memory contact via structures 88 may be formed to the drain regions 63 to electrically connect the bit lines (not shown) to the drain regions 63 at the same time as the additional contact via structures (8G, 8A), rather than during a separate prior step shown in FIG. 5A. Likewise, the word line contact via structures (not shown in the plane of FIG. 12) may be formed in contact with the word lines/control gate electrodes 46 during this step.

Figure 13:
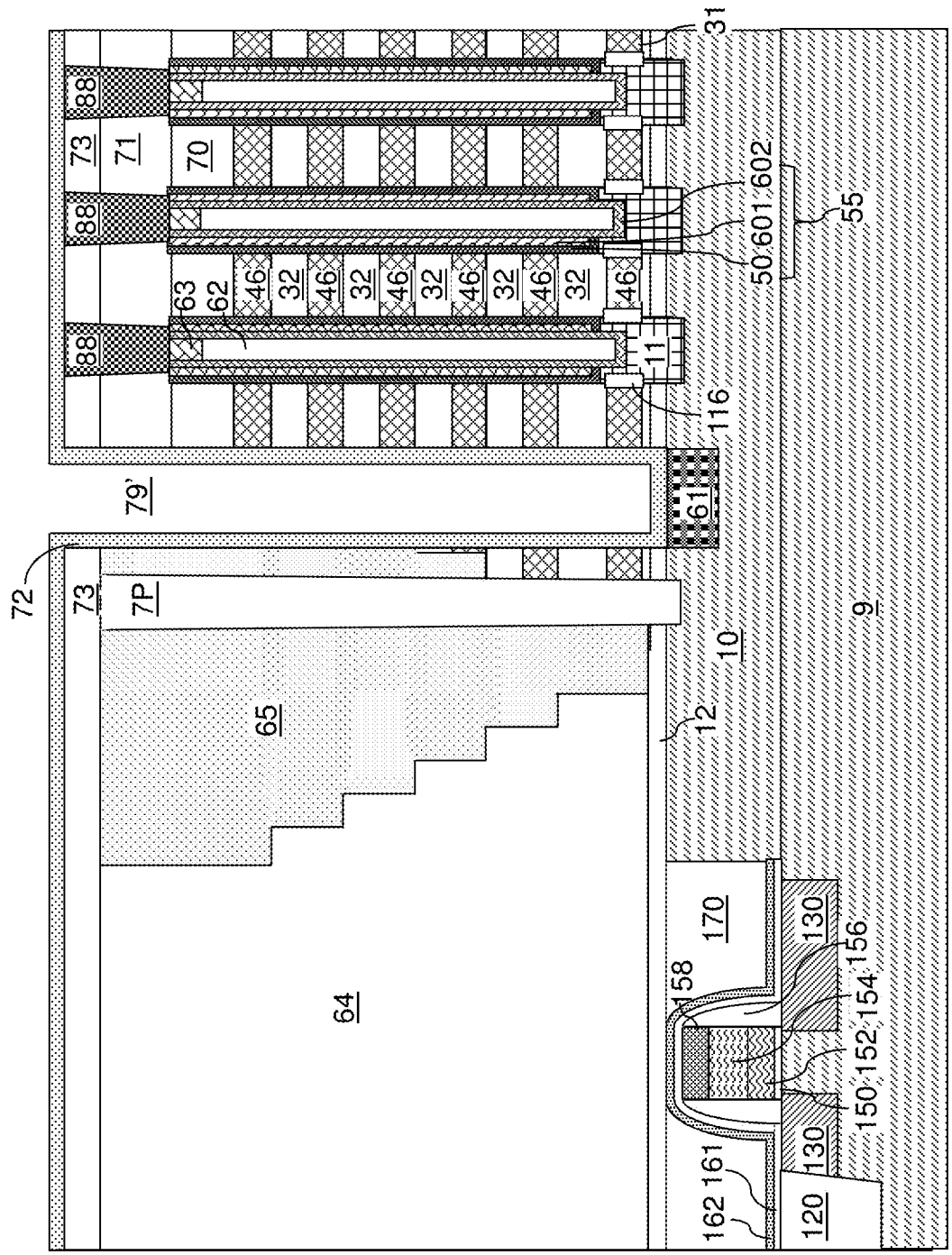
FIG. 13 is a vertical cross-sectional view of a second exemplary structure after deposition of a silicon nitride layer according to a second embodiment of the present disclosure.

Referring to FIG. 13, a second exemplary structure according to the second embodiment of the present disclosure can be derived from the first exemplary structure of FIG. 8 by depositing a silicon nitride layer 72. The silicon nitride layer 72 can be formed in the same manner as in the first embodiment. The thickness of the silicon nitride layer 72 can be in a range from 3 nm to 60 nm, although lesser and greater thicknesses can also be employed.

Figure 14:
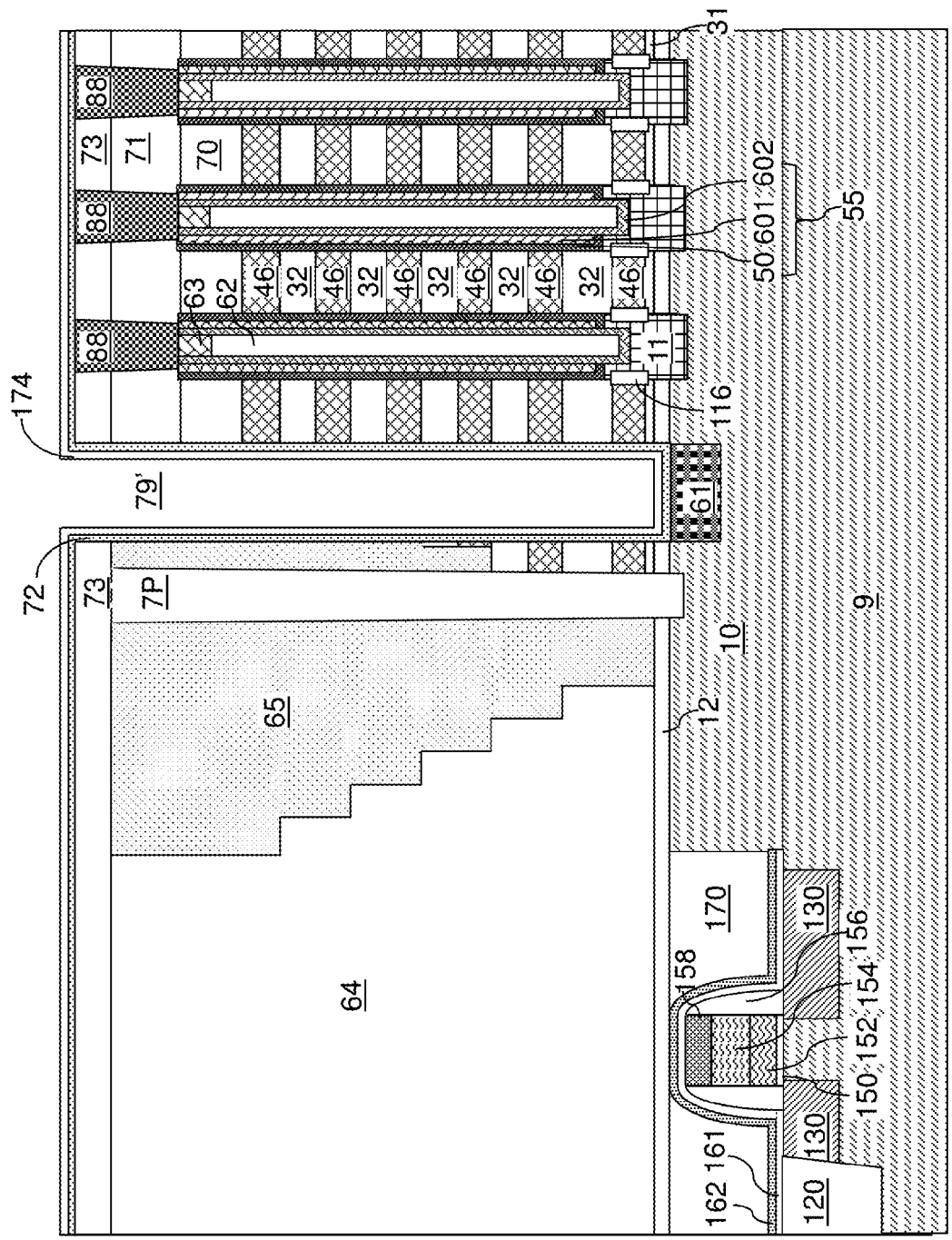
FIG. 14 is a vertical cross-sectional view of the second exemplary structure after conversion of a portion of the silicon nitride layer into a silicon oxynitride layer according to the second embodiment of the present disclosure.

Referring to FIG. 14, an oxidation process is performed to convert a contiguous surface portion of the silicon nitride layer 72 into a silicon oxynitride layer 174. As used herein, a "silicon oxynitride layer" refers to a layer of silicon oxynitride. As used herein, "silicon oxynitride" refers to a dielectric compound of silicon, nitrogen, and oxygen such that the atomic percentage of nitrogen is greater than 1% and the atomic percentage of oxygen is greater than 1% among all atoms of the dielectric compound. The oxidation process can be a thermal oxidation process or a plasma oxidation process. If a thermal oxidation process is employed, a wet oxidation process employing $H_2O$ vapors as an oxidizing gas may be performed, or a dry oxidation process employing $O_2$ gas as an oxidizing agent may be performed. If a plasma oxidation process is employed, an oxygen-containing gas (such as oxygen or ozone) can be employed to generate an oxygen-containing plasma to form an oxide using radical in-situ steam generation oxidation or slot plane antenna oxidation. A dielectric surface composed of a dielectric material including at least silicon atoms and oxygen atoms is provided within the backside contact trench 79.

The oxidation process can partially replace the nitrogen atoms in the surface portion of the silicon nitride layer 72 with oxygen atoms to form the silicon oxynitride layer 174. A surface portion of the silicon nitride layer 72 is oxidized to form the silicon oxynitride layer 174. A remaining outer portion of the silicon nitride layer 72 can be present between the silicon oxynitride layer 174 and the sidewalls trench, such as the sidewalls of the electrically insulating layers 32 and the electrically conductive layers 46 in the trench. The thickness of the silicon nitride layer 72 after the oxidation process can be in a range from 1 nm to 30 nm, and the thickness of the silicon oxynitride layer 174 can be in a range from 2 nm to 30 nm, although lesser and greater thicknesses can also be employed. Because replacement of nitrogen atoms with oxygen atoms can be limited by transport of oxygen atoms through the surface region of the silicon nitride layer 72, the degree of replacement of oxygen atoms with nitrogen atoms can be a function of proximity to the physically exposed surface of the silicon nitride layer 72 prior to oxidation. Thus, the silicon oxynitride layer 174 can have a concentration gradient such that the atomic concentration of oxygen increases with the distance from the interface with the silicon nitride layer 72.

Figure 15:
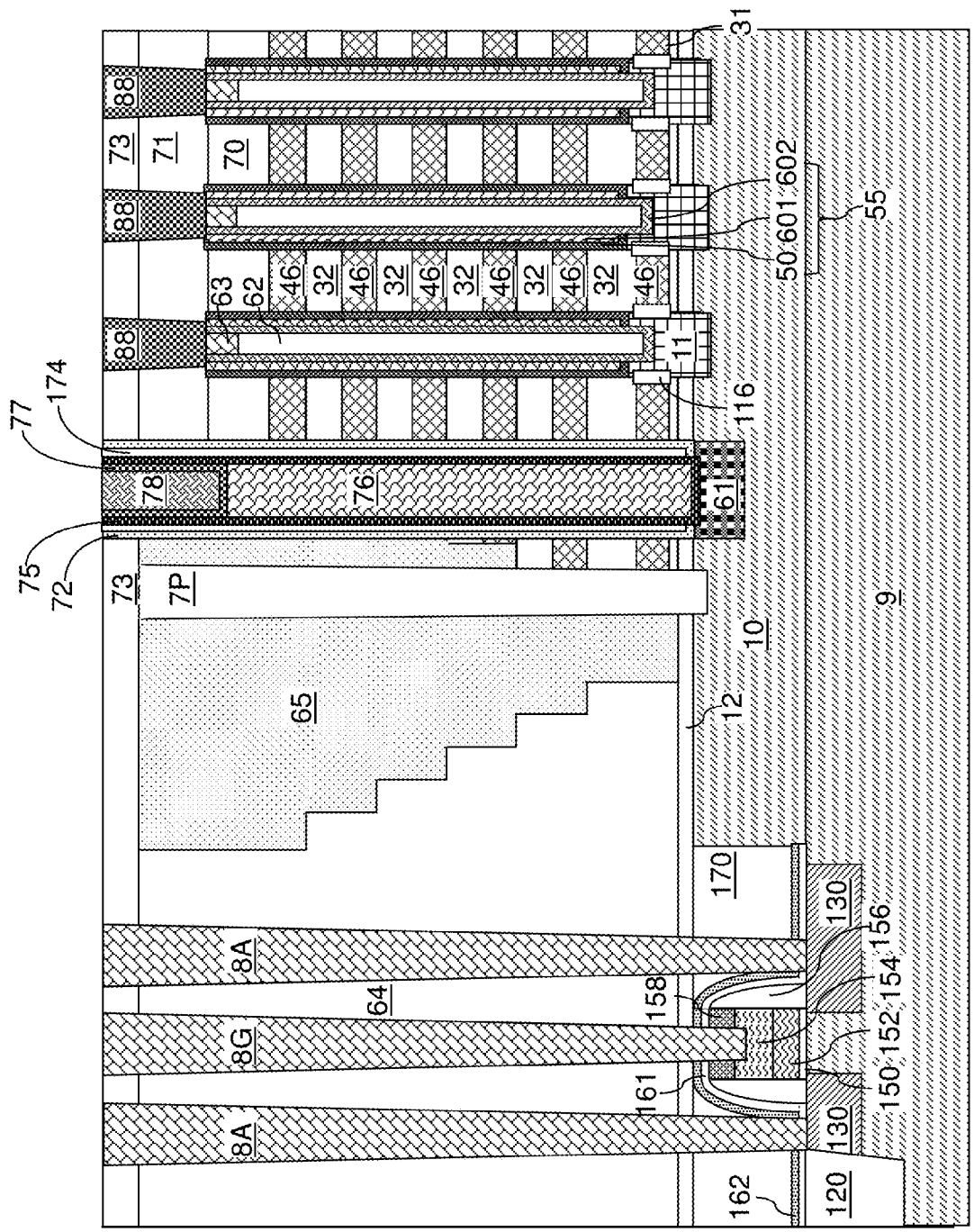
FIG. 15 is a vertical cross-sectional view of the second exemplary structure after formation of various contact via structures according to the second embodiment of the present disclosure.

Referring to FIG. 15, horizontal portions of dielectric materials of the silicon nitride layer 72 and the silicon oxynitride layer 174 can be anisotropically etched. Specifically, an anisotropic etch process can be performed to remove horizontal portions of the silicon nitride layer 72 and the silicon oxynitride layer 174 from above the top surface of the at least one contact level dielectric layer (71, 73) and from the bottom region of the backside contact trench 79. Remaining vertical portions of the silicon nitride layer 72 and the silicon oxynitride layer 174 within the backside contact trench 29 constitute an insulating spacer (72, 174). The insulating spacer (72, 174) can be topologically homeomorphic to a torus. In one embodiment, an annular bottom surface of the insulating spacer (72, 174) can contact a top surface of the source region 61. The insulating spacer (72, 174) can extend from the top surface of the at least one contact level dielectric layer (71, 73) to the top surface of the substrate (9, 10).

Subsequently, the processing steps of FIGS. 11 and 12 can be performed to form a backside contact via structure {(75, 78) or (75, 76, 77, 78)}, which is a contact via structure electrically shorted to a portion (e.g., source region 61) of the substrate (9, 10) and laterally surrounded by the insulating spacer (72, 174). The insulating spacer (72, 174) comprises a silicon nitride layer 72 which functions as a diffusion barrier dielectric layer that prevents diffusion of fluorine atoms therethrough. Thus, if residual fluorine atoms are present in the electrically conductive layers 46, the residual fluorine atoms that are present in the electrically conductive layers 46 cannot diffuse through the insulating spacer (72, 174), and electrical shorts caused by fluorine atom diffusion along the backside contact trench 79 can be avoided.

Subsequently, additional contact via structures (8G, 8A) can be formed through the dielectric material portion 64 and to various electrically active components in a peripheral device region. For example, the additional contact via structures (8G, 8A) can include at least one gate contact via structure 8G and at least one active region contact via structure 8A. Likewise, memory contact via structures 88 and word line contact via structures may be formed during this step.

Each of the first and second exemplary structures can include a device structure that comprises a stack of alternating layers comprising electrically insulating layers 32 and electrically conductive layers 46 and located over a substrate (9, 10), a trench (i.e., a backside contact trench 79) extending through the stack of alternating layers, and an insulating spacer {(72, 74) or (72, 174)} located at a periphery of the trench and contacting sidewalls of the trench, such as the electrically conductive layers 46 in the trench, and comprising a lateral stack, from outside to inside, of a silicon nitride layer 72 and a silicon and oxygen containing dielectric layer (74 or 174). The silicon and oxygen containing dielectric layer (74 or 174) can be selected from a silicon oxynitride layer 174 and a silicon oxide layer 74. A contact via structure {(75, 78) or (75, 76, 77, 78)} is provided within the insulating spacer {(72, 74) or (72, 174)}. The contact via structure {(75, 78) or (75, 76, 77, 78)} comprises at least one conductive material, extends through the insulating spacer {(72, 74) or (72, 174)}, and is electrically shorted to a portion of the substrate (9, 10), such as the source region 61.

In the first exemplary structure, the silicon and oxygen containing dielectric layer can be a silicon oxide layer 74 comprising a material selected from doped silicate glass and undoped silicate glass. In the second exemplary structure, the silicon and oxygen containing dielectric layer can be a silicon oxynitride layer 174 in which the atomic concentration of oxygen increases with a distance from the interface with the silicon nitride layer 72 and the atomic concentration of nitrogen decreases with the distance from the interface with the silicon nitride layer 72.

Each of the first and second exemplary structures can further comprise a memory opening 49 extending through the stack of alternating layers, and a memory stack structure 55 located in the memory opening 49. The memory stack structure 55 can comprise a memory film 50 and a semiconductor channel (601, 602) contacting an inner sidewall of the memory film 50. The electrically conductive layers 46 can comprise, or can be electrically connected to, control gate electrodes for the memory stack structure 55. A drain region 63 can contact a top portion of the semiconductor channel (601, 602), and a source region 61 can be located within the substrate (9, 10), and can contact a bottom surface of the contact via structure {(75, 78) or (75, 76, 77, 78)}.

Figure 16:
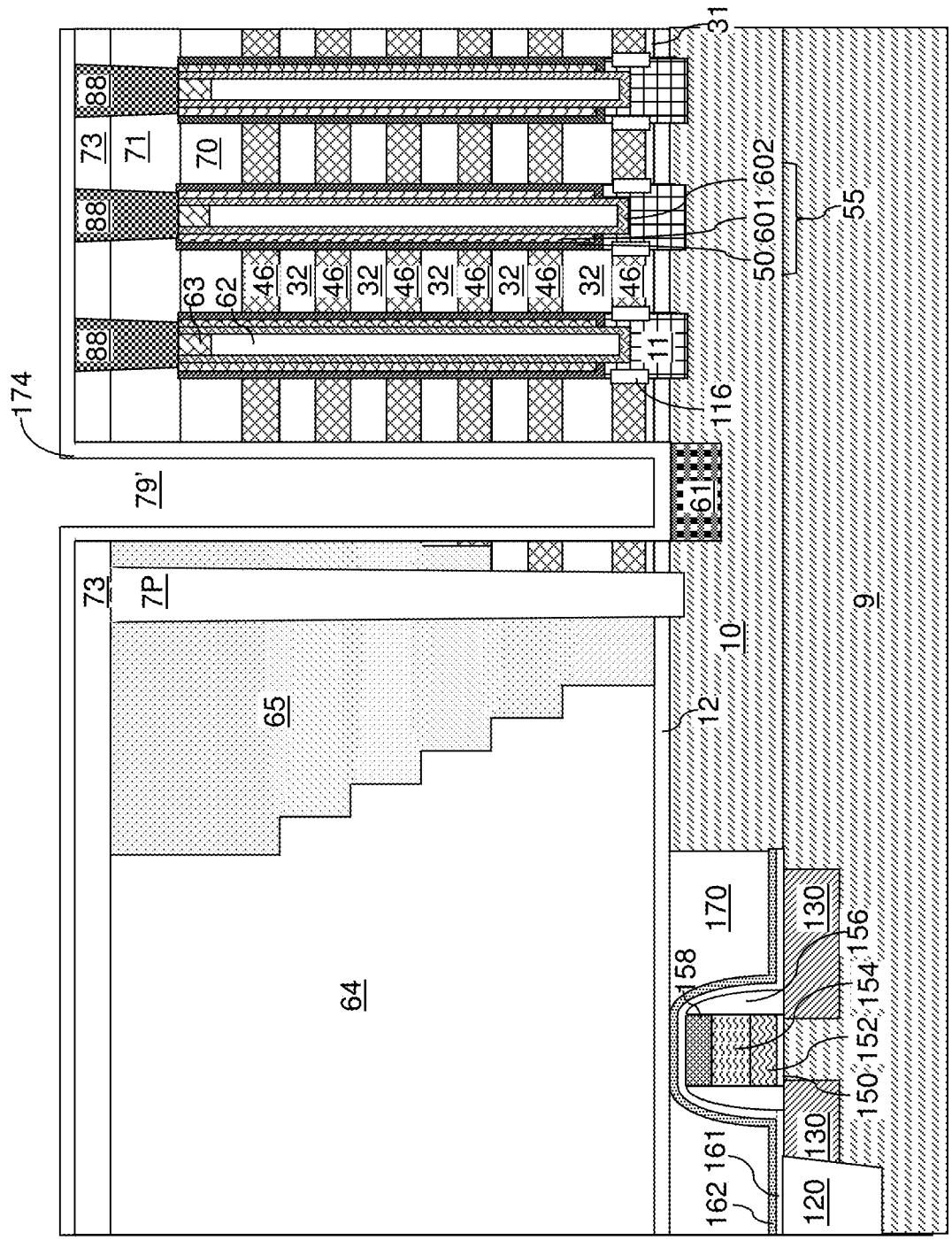
FIG. 16 is a vertical cross-sectional view of a third exemplary structure conversion of the entirety of the silicon nitride layer into a silicon oxynitride layer according to a third embodiment of the present disclosure.

Referring to FIG. 16, a third exemplary structure according to a third embodiment of the present disclosure can be derived from the second exemplary structure of FIG. 13 by oxidizing the entirety of the silicon nitride layer 72 to convert the entirety of the silicon nitride layer 72 into a silicon oxynitride layer 174. Specifically, an oxidation process is performed to convert the entirety of the silicon nitride layer 72 into a silicon oxynitride layer 174. The oxidation process can be a thermal oxidation process or a plasma oxidation process. The same oxidation process can be employed as in the second embodiment with the modification on the duration of the oxidation process such that the entirety of the silicon nitride layer 72 is oxidized into a silicon oxynitride layer 174.

A dielectric surface composed of a dielectric material including at least silicon atoms and oxygen atoms is provided within the backside contact trench 79. The dielectric surface is a silicon oxynitride surface. The silicon oxynitride layer 174 can contact the sidewalls of the trench, such as the sidewalls of the electrically conductive layers 46 and insulating layers 32 exposed in the trench. The oxidation process can partially replace the nitrogen atoms in the silicon nitride layer 72 with oxygen atoms to form the silicon oxynitride layer 174. The thickness of the silicon oxynitride layer 174 can be in a range from 3 nm to 60 nm. Because replacement of oxygen atoms with nitrogen atoms can be limited by transport of oxygen atoms through the surface region of the silicon nitride layer 72, the degree of replacement of oxygen atoms with nitrogen atoms can be a function of proximity to the physically exposed surface of the silicon nitride layer 72 prior to oxidation. Thus, the silicon oxynitride layer 174 can have a concentration gradient such that the atomic concentration of oxygen increases with the distance from the interface between the silicon oxynitride layer 174 and the electrically conductive layers 46.

Figure 17:
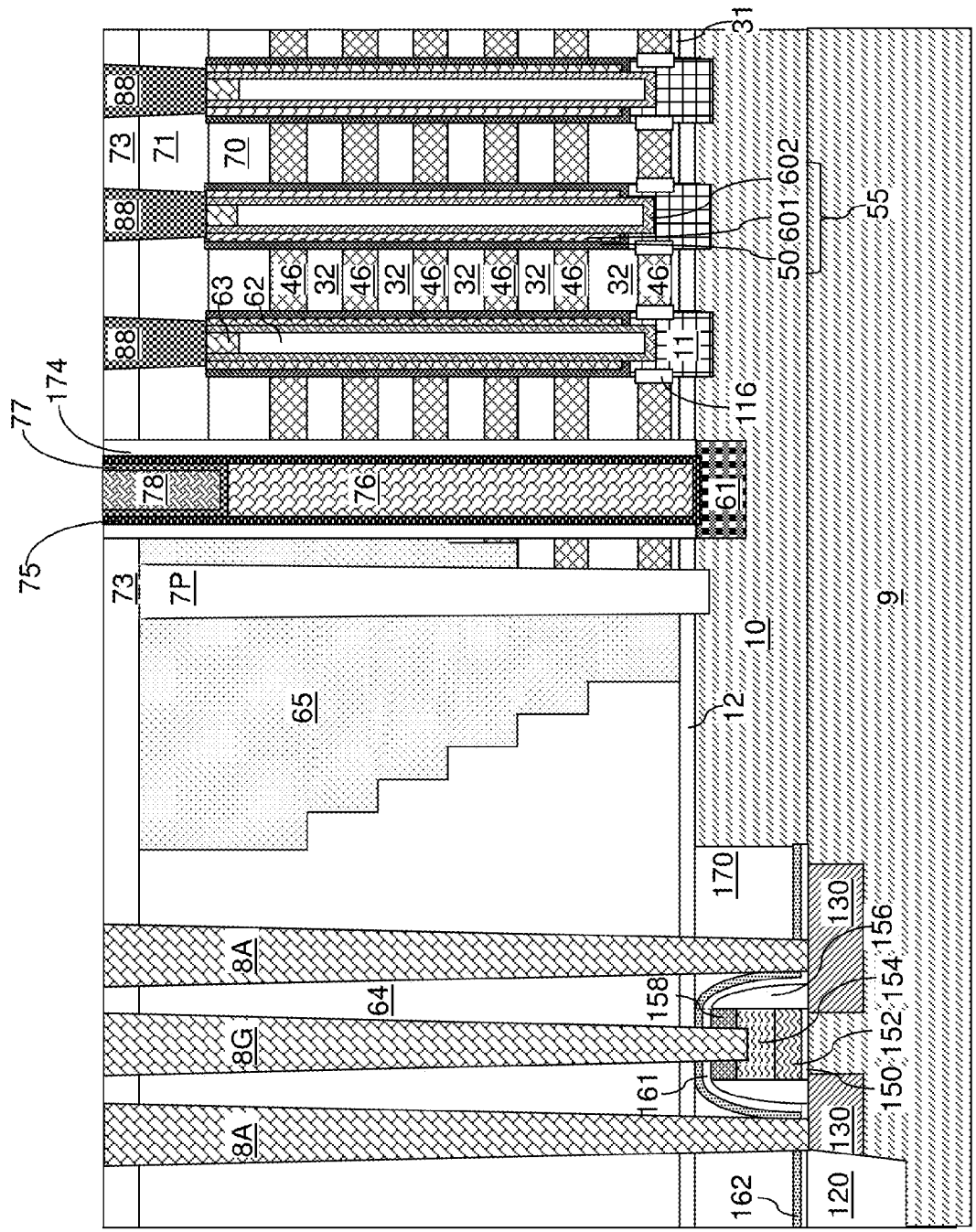
FIG. 17 is a vertical cross-sectional view of the third exemplary structure after formation of various contact via structures according to the third embodiment of the present disclosure.

Referring to FIG. 17, horizontal portions of dielectric material of the silicon oxynitride layer 174 can be anisotropically etched. Specifically, an anisotropic etch process can be performed to remove horizontal portions of the silicon oxynitride layer 174 from above the top surface of the at least one contact level dielectric layer (71, 73) and from the bottom region of the backside contact trench 79. Remaining vertical portions of the silicon oxynitride layer 174 within the backside contact trench 79 constitute an insulating spacer 174. The insulating spacer 174 can be topologically homeomorphic to a torus. In one embodiment, an annular bottom surface of the insulating spacer 174 can contact a top surface of the source region 61. The insulating spacer 174 can extend from the top surface of the at least one contact level dielectric layer (71, 73) to the top surface of the substrate (9, 10).

Subsequently, the processing steps of FIGS. 11 and 12 can be performed to form a backside contact via structure {(75, 78) or (75, 76, 77, 78)} which is a contact via structure electrically shorted to a portion 61 of the substrate (9, 10) and laterally surrounded by the insulating spacer 174. The insulating spacer 174 comprises a silicon oxynitride layer 174 which functions as a diffusion barrier dielectric layer that prevents diffusion of fluorine atoms therethrough. Thus, if residual fluorine atoms are present in the electrically conductive layers 46, the residual fluorine atoms that are present in the electrically conductive layers 46 cannot diffuse through the insulating spacer 174, and electrical shorts caused by fluorine atom diffusion along the backside contact trench 79 can be avoided.

Subsequently, additional contact via structures (8G, 8A) can be formed through the dielectric material portion 64 to various electrically active components in a peripheral device region. For example, the additional contact via structures (8G, 8A) can include at least one gate contact via structure 8G and at least one active region contact via structure 8A. Memory contact via structures 88 and the word line contact via structures may also be formed at this time.

Figure 18:
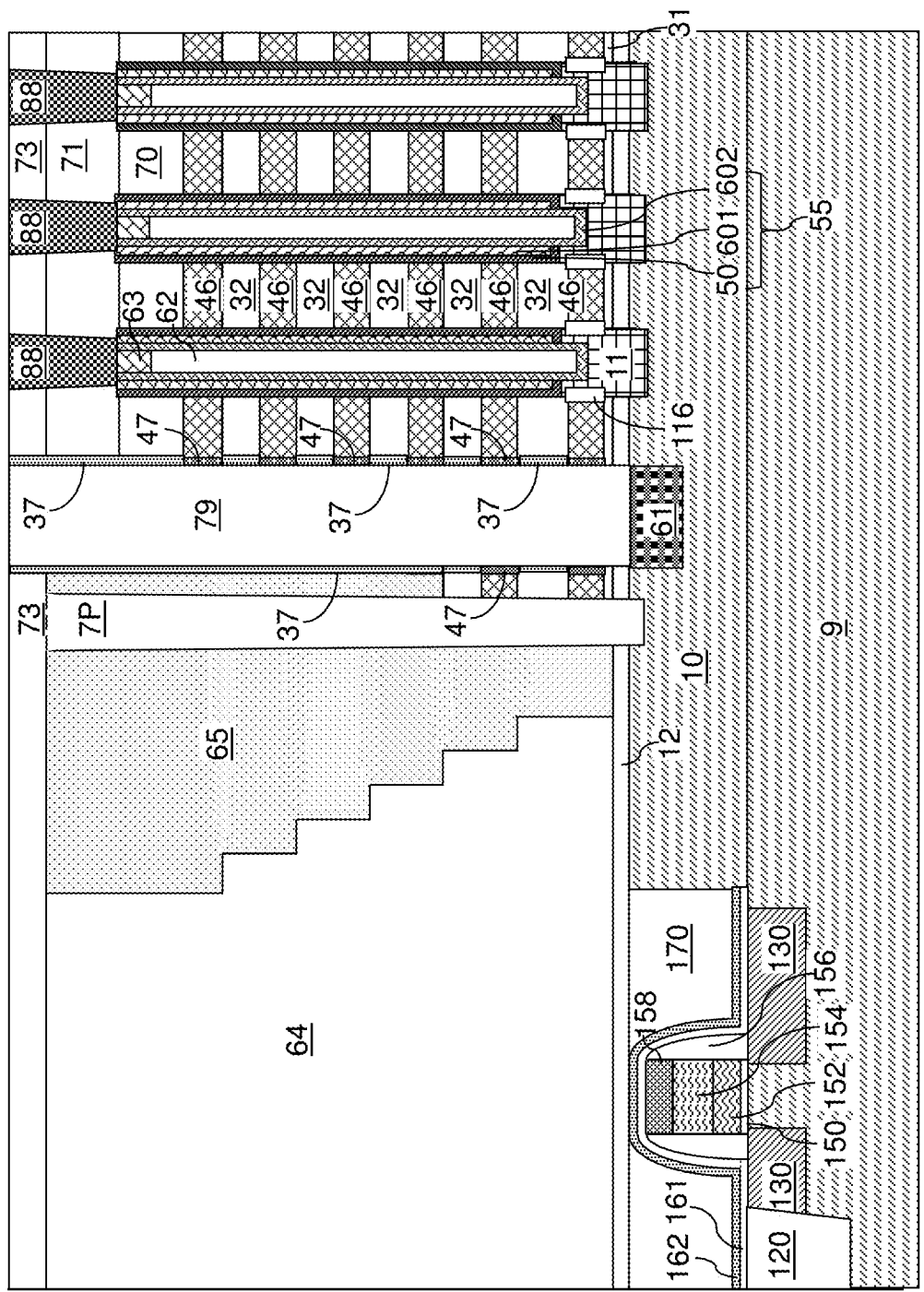
FIG. 18 is a vertical cross-sectional view of a fourth exemplary structure after formation of metal nitride portions according to a fourth embodiment of the present disclosure.

Referring to FIG. 18, a fourth exemplary structure according to a fourth embodiment of the present disclosure can be derived from the first exemplary structure of FIG. 8 by nitriding physically exposed sidewall surfaces of the trench, such as the electrically conductive layers 46 and the insulating layers 32 at a peripheral region of the backside contact trench 79. Surface portions of the electrically conductive layers 46 can be converted into metal nitride portions 47 and surface portions of the silicon oxide insulating layers 32 can be converted into silicon oxynitride or nitride portions 37 by the nitridation process. A thermal nitridation process or a plasma nitridation process may be employed. If a thermal nitridation process is employed, a nitrogen-containing gas (such as nitrous oxide, nitric oxide, or ammonia) can be employed as a process gas during the thermal nitridation process. If a plasma nitridation process is employed, a plasma of a nitrogen-containing gas (such as nitrous oxide, nitric oxide, or ammonia) can be employed to generate a nitrogen-containing plasma, using a slot plane antenna or another method.

The silicon nitride or oxynitride portions 37 comprise an insulating material having a thickness of 1 to 10 nm, such as 1 to 2 nm. The metal nitride portions 47 comprise a nitride of the metallic material of the electrically conductive layers 46. For example, if the electrically conductive layers 46 comprise tungsten, the metal nitride portions 47 can comprise tungsten nitride. If the electrically conductive layers 46 comprise ruthenium, the metal nitride portions 47 can comprise ruthenium nitride. If the electrically conducive layers 46 comprise cobalt, the metal nitride portions 47 can comprise cobalt nitride. The metal nitride portions 47 can be a conductive material. The thickness of the metal nitride portions 47 can be uniform, and can be in a range from 1 nm to 10 nm, although lesser and greater thicknesses can also be employed.

The metal nitride portions 47 can be a diffusion barrier layer that prevents diffusion of fluorine atoms therethrough. Thus, if residual fluorine atoms are present in the electrically conductive layers 46, the residual fluorine atoms that are present in the electrically conductive layers 46 cannot diffuse through the metal nitride portions 47, and electrical shorts caused by fluorine atom diffusion along the backside contact trench 79 can be avoided.

Figure 19:
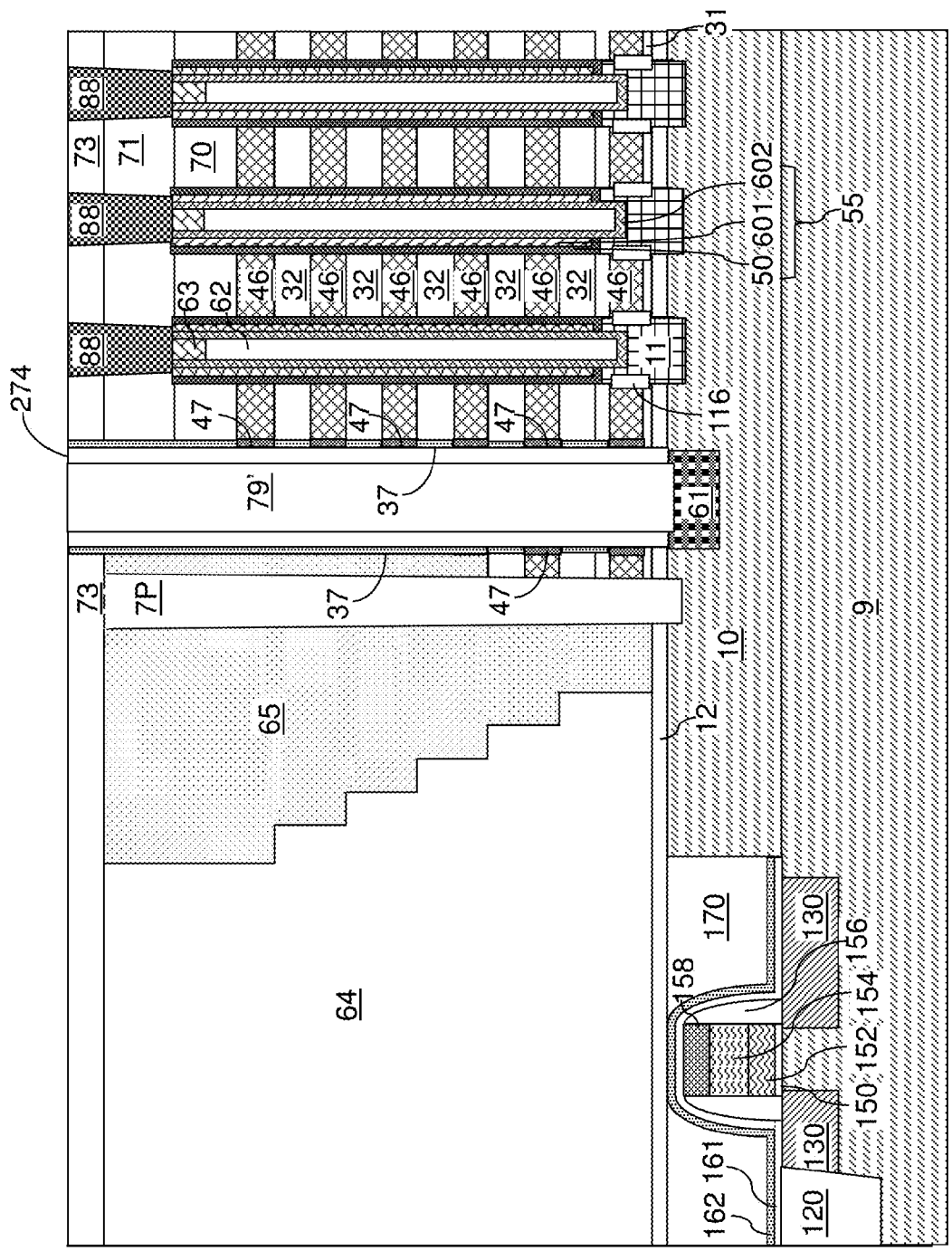
FIG. 19 is a vertical cross-sectional view of the fourth exemplary structure after formation of an insulating spacer according to the fourth embodiment of the present disclosure.

Referring to FIG. 19, one or more insulating material layers can be formed in the at least one backside contact trench 79 and over the second contact level dielectric layer 73 by at least one conformal deposition process and optionally an oxidation process. Exemplary conformal deposition processes include, but are not limited to, chemical vapor deposition and atomic layer deposition. Each of the one or more insulating material layers includes an insulating material such as a dielectric metal oxide (such as aluminum oxide), silicon oxide, silicon nitride, organosilicate glass, nitrogen-doped organosilicate glass, or a combination thereof. The total thickness of the one or more insulating material layers can be in a range from 1.5 nm to 60 nm, although lesser and greater thicknesses can also be employed.

In one embodiment, the one or more insulating material layers can be the stack of a silicon nitride layer 72 and a silicon oxide layer 74 of the first embodiment. In another embodiment, the one or more insulating material layers can be the stack of a silicon nitride layer 72 and a silicon oxynitride layer 174 of the second embodiment. In yet another embodiment, the one or more insulating material layers can be the silicon oxynitride layer 174 of the third embodiment. Still alternately, the one or more insulating material layers can be different in composition from the various dielectric material layers employed to form an insulating spacers of the first, second, and third embodiments. In one embodiment, the insulating spacer 274 can comprise silicon oxide, such as at least one of an undoped silicate glass, a doped silicate glass, silicon nitride, and silicon oxynitride.

An anisotropic etch is performed to remove horizontal portions of the one or more insulating material layers. A remaining portion of the one or more insulating material layers inside the backside contact trench 79 constitutes an insulating spacer 274, which can be a vertically elongated annular structure with a cavity therethrough. In one embodiment, an annular bottom surface of the insulating spacer 274 contacts a top surface of the source region 61. The insulating spacer 274 can be formed on the metal nitride portions 47 and the silicon nitride or oxynitride portions 37.

Figure 20:
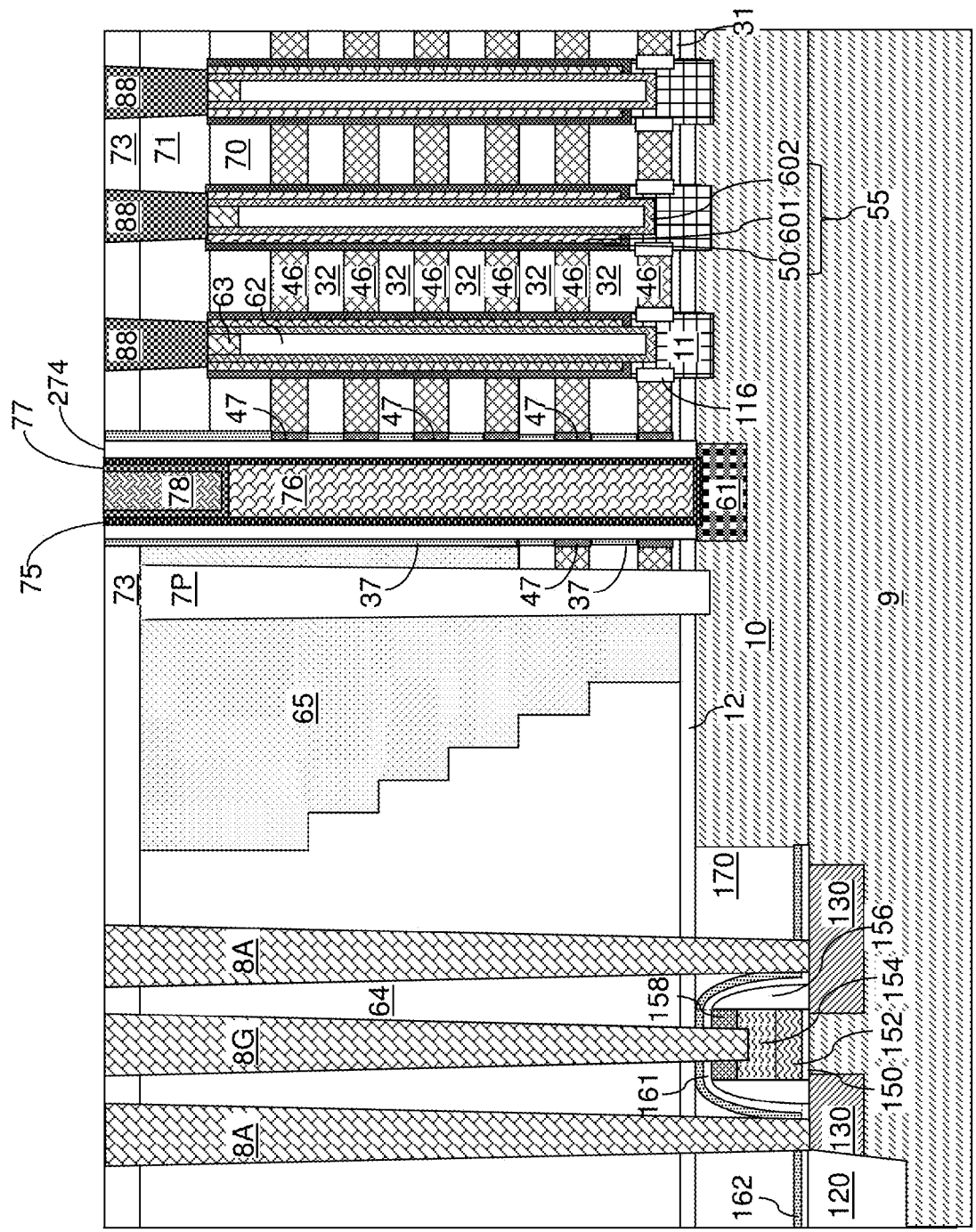
FIG. 20 is a vertical cross-sectional view of the fourth exemplary structure after formation of various contact via structures according to the fourth embodiment of the present disclosure.

Referring to FIG. 20, the processing steps of FIGS. 11 and 12 can be performed to form a backside contact via structure {(75, 78) or (75, 76, 77, 78)}, which is a contact via structure electrically shorted to a portion 61 of the substrate (9, 10) and laterally surrounded by the insulating spacer 274. The metal nitride portions 47 function as diffusion barrier dielectric portions that prevent diffusion of fluorine atoms therethrough. Thus, if residual fluorine atoms are present in the electrically conductive layers 46, the residual fluorine atoms that are present in the electrically conductive layers 46 cannot diffuse through the metal nitride portions 47, and electrical shorts caused by fluorine atom diffusion along the backside contact trench 79 can be avoided.

Subsequently, additional contact via structures (8G, 8A) can be formed through the dielectric material portion 64 to various electrically active components in a peripheral device region. For example, the additional contact via structures (8G, 8A) can include at least one gate contact via structure 8G and at least one active region contact via structure 8A. Memory contact via structures 88 and word line contact via structures may also be formed at this time.

The fourth exemplary structure includes a device structure, which comprises a stack of alternating layers comprising electrically insulating layers 32 and electrically conductive layers 46 and located over a substrate; a trench (i.e., a backside contact trench 79) extending through the stack of alternating layers; and metal nitride portions 47 located at a periphery of the trench and contacting sidewalls of the electrically conductive layers 46. The metal nitride portions 47 comprise a nitride of a conductive material of the electrically conductive layers 46. Silicon nitride or oxynitride portions 37 are located at the periphery of the trench and contacting the sidewalls of the silicon oxide insulating layers 32. An insulating spacer 274 can be located in the trench, and can be laterally spaced from the electrically conductive layers 46 by the metal nitride portions 47. A contact via structure {(75, 78) or (75, 76, 77, 78)} is provided, which comprises at least one conductive material, extends through the insulating spacer 274, and is electrically shorted to a portion 61 of the substrate (9, 10) such as the source region 61.

In one embodiment, the metal nitride portions 47 can have a uniform lateral thickness. Each electrically conductive layer 46 can be laterally spaced from the insulating spacer 274 by a metal nitride portion 47. In one embodiment, the electrically conductive layers 46 comprise tungsten layers, and the metal nitride portions 47 comprise tungsten nitride portions. In one embodiment, the metal nitride portions 47 can be vertically spaced from one another by silicon nitride or oxynitride portions 37, and the vertical extent of each metal nitride portion 47 can be the same as the vertical extent of the electrically conductive layer 47 that the metal nitride portion 47 contacts.

The fourth exemplary structure can further comprise a memory opening 49 extending through the stack of alternating layers, and a memory stack structure 55 located in the memory opening 49. The memory stack structure 55 can comprise a memory film 50 and a semiconductor channel (601, 602) contacting an inner sidewall of the memory film 50. The electrically conductive layers 46 can comprise, or can be electrically connected to, control gate electrodes for the memory stack structure 55. A drain region 63 can contact a top portion of the semiconductor channel (601, 602), and a source region 61 can be located within the substrate (9, 10), and can contact a bottom surface of the contact via structure {(75, 78) or (75, 76, 77, 78)}.

Each of the first through fourth exemplary structures can comprise a monolithic three-dimensional memory device. In one embodiment, the monolithic three-dimensional memory device comprises a vertical NAND device located over the substrate, and the electrically conductive layers 46 comprise, or are electrically connected to, a respective word line of the NAND device. In one embodiment, the substrate (9, 10) comprises a silicon substrate, the vertical NAND device comprises an array of monolithic three-dimensional NAND strings located over the silicon substrate. At least one memory cell in a first device level of the array of monolithic three-dimensional NAND strings is located over another memory cell in a second device level of the array of monolithic three-dimensional NAND strings. The silicon substrate can contain an integrated circuit comprising a driver circuit for the memory device located thereon.

The array of monolithic three-dimensional NAND strings can comprise a plurality of semiconductor channels (601, 602). At least one end portion of each of the plurality of semiconductor channels (601, 602) extends substantially perpendicular to a top surface of the substrate. The array of monolithic three-dimensional NAND strings can comprise a plurality of charge storage elements. Each charge storage element can be located adjacent to a respective one of the plurality of semiconductor channels (601, 602). The array of monolithic three-dimensional NAND strings can comprise a plurality of control gate electrodes having a strip shape extending substantially parallel to the top surface of the substrate. The plurality of control gate electrodes comprises at least a first control gate electrode located in the first device level and a second control gate electrode located in the second device level.

The various structures of the present disclosure provide one or more diffusion barrier structures that prevent diffusion of fluorine therethrough. Thus, even if the electrically conductive layers 46 or the contact via structure {(75, 78) or (75, 76, 77, 78)} includes residual fluorine atoms, the fluorine atoms cannot pass through the one or more diffusion barrier structures. Electrical shorts caused by fluorine diffusion can be reduced or eliminated by employing the one of more diffusion barrier structures of the present disclosure.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A method of forming a device structure, comprising:
   forming a stack of alternating layers comprising electrically insulating layers and sacrificial material layers over a substrate;
   forming a trench through the stack of alternating layers;
   replacing the sacrificial material layers with electrically conductive layers;
   performing a nitridation process, wherein surface portions of the electrically conductive layers at a peripheral region of the trench are converted into conductive metal nitride portions and surface portions of the electrically insulating layers at the peripheral region of the trench are converted into silicon nitride or silicon oxynitride portions by the nitridation process; and
   forming a contact via structure over the silicon nitride or silicon oxynitride.
2. The method of claim 1, wherein the electrically conductive layers are deposited through the trench employing at least one fluorine-containing precursor gas.

3. The method of claim 2, wherein a molecule of the at least one fluorine-containing precursor gas comprises a compound of at least one tungsten atom and at least one fluorine atom.

4. The method of claim 1, wherein:
backside recesses are formed by introducing an etchant through the trench and etching the sacrificial material layers selective to the electrically insulating layers;
a conductive material is deposited within the trench and over the stack of alternating materials during formation of the electrically conductive layers such that the backside recesses are filled with the conductive material to form the electrically conductive layers; and
portions of the conductive material are removed from inside the trench and from above the stack of alternating materials to provide physically exposed surfaces of the electrically conductive layers.

5. The method of claim 1, further comprising:
forming an insulating spacer by anisotropically etching horizontal portions of at least one dielectric material that is present within the trench; and
depositing a conductive material in a cavity within the insulating spacer such that the conductive material is electrically shorted to a portion of the substrate to form the contact via structure.

6. The method of claim 5, further comprising:
forming a memory opening through the stack of alternating layers; and
forming a memory stack structure in the memory opening, the memory stack structure comprising a memory film and a semiconductor channel contacting an inner sidewall of the memory film,
wherein the electrically conductive layers comprise, or are electrically connected to, control gate electrodes for the memory stack structure.

7. The method of claim 6, wherein:
the device structure comprises a vertical NAND device located over the substrate;
the electrically conductive layers comprise, or are electrically connected to, a respective word line of the NAND device;
the substrate comprises a silicon substrate;
the vertical NAND device comprises an array of monolithic three-dimensional NAND strings over the silicon substrate;
at least one memory cell in a first device level of the array of monolithic three-dimensional NAND strings is located over another memory cell in a second device level of the array of monolithic three-dimensional NAND strings;
the silicon substrate contains an integrated circuit comprising a driver circuit for the memory device located thereon; and
the array of monolithic three-dimensional NAND strings comprises:
a plurality of semiconductor channels, wherein at least one end portion of each of the plurality of semiconductor channels extends substantially perpendicular to a top surface of the substrate;
a plurality of charge storage elements, each charge storage element located adjacent to a respective one of the plurality of semiconductor channels; and
a plurality of control gate electrodes having a strip shape extending substantially parallel to the top surface of the substrate, the plurality of control gate electrodes comprise at least a first control gate electrode located in the first device level and a second control gate electrode located in the second device level.

8. A method of forming a device structure, comprising:
forming a stack of alternating layers comprising electrically insulating layers and sacrificial material layers over a substrate;
forming a trench through the stack of alternating layers;
replacing the sacrificial material layers with electrically conductive layers;
converting surface portions of the electrically conductive layers at a peripheral region of the trench into conductive metal nitride portions by performing a nitridation process;
forming an insulating spacer on the metal nitride portions; and
forming a contact via structure electrically shorted to a portion of the substrate by depositing a conductive material in a cavity within the insulating spacer.

9. The method of claim 8, wherein the electrically conductive layers are deposited through the trench employing at least one tungsten and fluorine containing precursor gas.

10. The method of claim 8, wherein:
the insulating spacer is formed by depositing an insulating material layer on the metal nitride portions and over the stack of alternating layers and removing horizontal portions of the insulating material layer employing an anisotropic etch;
a remaining portion of the insulating material layer in the trench constitutes the insulating spacer;
the insulating spacer comprises a silicon oxide spacer;
the electrically insulating layers comprise silicon oxide layers; and
the step of nitriding further converts surface portions of the silicon oxide electrically insulating layers at a peripheral region of the trench into silicon nitride or oxynitride portions.

11. The method of claim 8, wherein:
backside recesses are formed by introducing an etchant through the trench and etching the sacrificial material layers selective to the electrically insulating layers;
a conductive material is deposited within the trench and over the stack of alternating materials during formation of the electrically conductive layers such that the backside recesses are filled with the conductive material to form the electrically conductive layers; and
portions of the conductive material are removed from inside the trench and from above the stack of alternating materials to provide the physically exposed surfaces of the electrically conductive layers; and
further comprising:
forming a memory opening through the stack of alternating layers; and
forming a memory stack structure in the memory opening, the memory stack structure comprising a memory film and a semiconductor channel contacting an inner sidewall of the memory film;
wherein the electrically conductive layers comprise, or are electrically connected to, control gate electrodes for the memory stack structure.

12. The method of claim 8, wherein:
the device structure comprises a vertical NAND device located over the substrate;
the electrically conductive layers comprise, or are electrically connected to, a respective word line of the NAND device;
the substrate comprises a silicon substrate;

the vertical NAND device comprises an array of monolithic three-dimensional NAND strings over the silicon substrate;

at least one memory cell in a first device level of the array of monolithic three-dimensional NAND strings is located over another memory cell in a second device level of the array of monolithic three-dimensional NAND strings;

the silicon substrate contains an integrated circuit comprising a driver circuit for the memory device located thereon; and the array of monolithic three-dimensional NAND strings comprises:
- a plurality of semiconductor channels, wherein at least one end portion of each of the plurality of semiconductor channels extends substantially perpendicular to a top surface of the substrate;
- a plurality of charge storage elements, each charge storage element located adjacent to a respective one of the plurality of semiconductor channels; and
- a plurality of control gate electrodes having a strip shape extending substantially parallel to the top surface of the substrate, the plurality of control gate electrodes comprise at least a first control gate electrode located in the first device level and a second control gate electrode located in the second device level.

13. The method of claim 1, further comprising:
forming memory openings through the stack of alternating layers; and
forming a memory stack structure in each of the memory openings prior to forming the trench, each of the memory stack structures comprising a memory film and a semiconductor channel.

14. The method of claim 13, further comprising forming backside recesses by removing the sacrificial material layers selective to the insulating layers and a material of an outermost layer of each memory film.

15. The method of claim 1, wherein the conductive metal nitride portions comprise a same metallic element as the electrically conductive layers and nitrogen atoms.

16. The method of claim 1, wherein physically exposed surface portions of the insulating layers at a periphery of the trench are nitrided during the nitridation process to form a nitrogen-containing dielectric material having a different composition than the conductive metallic nitride portions.

17. The method of claim 8, further comprising:
forming memory openings through the stack of alternating layers; and
forming a memory stack structure in each of the memory openings prior to forming the trench, each of the memory stack structures comprising a memory film and a semiconductor channel.

18. The method of claim 17, further comprising forming backside recesses by removing the sacrificial material layers selective to the insulating layers and a material of an outermost layer of each memory film.

19. The method of claim 8, wherein the conductive metal nitride portions comprise a same metallic element as the electrically conductive layers and nitrogen atoms.

* * * * *